(12) United States Patent
Wang

(10) Patent No.: US 11,851,532 B2
(45) Date of Patent: Dec. 26, 2023

(54) AROMATIC POLYSULFONE COPOLYMERS

(71) Applicant: HT Materials Corporation, Clifton Park, NY (US)

(72) Inventor: YiFeng Wang, Clifton Park, NY (US)

(73) Assignee: HT MATERIALS CORPORATION, Clifton Park, NY (US)

( * ) Notice: Subject to any disclaimer, the term of this patent is extended or adjusted under 35 U.S.C. 154(b) by 0 days.

(21) Appl. No.: 17/369,529

(22) Filed: Jul. 7, 2021

(65) Prior Publication Data

US 2023/0042839 A1 Feb. 9, 2023

(51) Int. Cl.
*C08G 75/23* (2006.01)
*C08G 73/06* (2006.01)
*H05K 1/02* (2006.01)
*C08L 27/12* (2006.01)

(52) U.S. Cl.
CPC ......... *C08G 75/23* (2013.01); *C08G 73/0677* (2013.01); *H05K 1/0298* (2013.01); *C08L 27/12* (2013.01)

(58) Field of Classification Search
CPC .. C08G 75/23; C08G 73/0677; C08G 75/205; C08G 65/40; H05K 1/0298; C08L 27/12; C08L 81/06; C08J 2381/06; C08J 5/18; G01N 2030/486
See application file for complete search history.

(56) References Cited

U.S. PATENT DOCUMENTS

| 3,480,593 A | 11/1969 | George et al. |
| 8,742,062 B2 | 6/2014 | Bhatnagar et al. |
| 2013/0085251 A1* | 4/2013 | Hay ................... C08G 65/4037 528/226 |

FOREIGN PATENT DOCUMENTS

| CN | 103450478 A | 12/2013 |
| CN | 103509185 A | 1/2014 |
| CN | 107840978 A | 3/2018 |
| WO | 2021252047 A1 | 12/2021 |
| WO | 2022010587 A1 | 1/2022 |
| WO | 2022060429 A1 | 3/2022 |

OTHER PUBLICATIONS

Precisionpunch, 2012.*
Feng et al., ""Preparation and characterization of poly(ether ether ketone)s containing benzimidazolone units", Journal of Polymer Research, Springer Netherlands, Dordrecht, vol. 23, No. 12, 2016; pp. 1-7."

* cited by examiner

*Primary Examiner* — Shane Fang
(74) *Attorney, Agent, or Firm* — CANTOR COLBURN LLP

(57) ABSTRACT

Compositions and methods for aromatic polysulfone copolymers are described herein. The polysulfone copolymers have advantageous properties, particularly in terms of high glass transition temperatures ($T_g$), improved thermal stability, improved flame resistance, good mechanical properties, chemical resistance and dimensional stability at elevated temperature. The polysulfone copolymers are suitable for manufacturing high temperature molded systems and other articles of manufacture via injection molding, extrusion, compression molding, coating, blow molding, thermoforming, rotational molding and additive manufacturing.

18 Claims, 3 Drawing Sheets

AROMATIC POLYSULFONE COPOLYMERS

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

REFERENCE TO A "SEQUENCE LISTING," A TABLE, OR A COMPUTER PROGRAM

Not Applicable

STATEMENT REGARDING PRIOR DISCLOSURES BY THE INVENTOR OR A JOINT INVENTOR

Not Applicable

FIELD OF THE INVENTION

The present invention generally relates to aromatic polysulfone copolymer compositions with improved heat resistance, thermal stability, and flame resistance, to a method of making the same, and to the use thereof in challenging environments.

BACKGROUND OF THE INVENTION

High performance aromatic polymers such as poly(aryl ether sulfone)s, poly(aryl ether imide), and poly(aryl ether ketone)s have high strength, heat resistance, modulus, low weight, electrical insulation, flame resistance, and broad chemical resistance, and so are widely used in applications as diverse as automotive, oil and gas, telecommunication, electrical/electronics, aerospace, water purification, hot water plumbing, and food processing and healthcare.

Poly(aryl ether sulfone)s (PAES), such as bisphenol-A polysulfone (PSU), polyethersulfone (PESU) and polyphenylsulfone (PPSU) are known for good transparency, low coefficient of thermal expansion, hydrolytical stability, high impact strength, dimensional stability, and retention of modulus at elevated temperature.

Poly(aryl ether sulfone)s are conventionally made by the nucleophilic polycondensation of bisphenol (such as, bisphenol-A, bis(4-hydroxyphenyl)sulfone, and 4,4'-biphenol) with bis(4-chlorophenyl)sulfone as described, for example, in U.S. Pat. Nos. 4,108,837, 4,175,175, and 6,228,970. PSU with a glass transition temperature ($T_g$) of 187° C., commercially available under trademark Udel® from Solvay Advanced Polymers LLC, is derived from bisphenol-A and bis(4-chlorophenyl)sulfone. Due to its relatively low $T_g$, it has limited applications at temperature above 180° C. PESU with glass transition temperature ($T_g$) of 220° C., commercially available under trademark Veradel® from Solvay Advanced Polymers LLC, is derived from bis(4-hydroxyphenyl)sulfone and bis(4-chlorophenyl)sulfone. PPSU with glass transition temperature ($T_g$) of 220° C., commercially available under the trademark Radel® from Solvay Advanced Polymers LLC, is derived from 4,4'-biphenol and bis(4-chlorophenyl)sulfone. Due to their excellent mechanical and other properties, PESU and PPSU can be used to manufacture a variety of useful articles such as molded articles, films, sheets and fibers. However, the glass transition temperature ($T_g$) of PESU and PPSU is 220° C. and cannot be used in applications where heat resistance of greater than 210° C. is required.

In U.S. Pat. No. 8,609,801, Hay et al teach a new class of polymers and copolymers containing 2H-benzimidazol-2-one moieties. In particular, Hay et al disclose a polyketone copolymer of 2H-benzimidazol-2-one and 2,2-bis(4-hydroxyphenyl)propane with 4,4'-difluorobenzophenone:

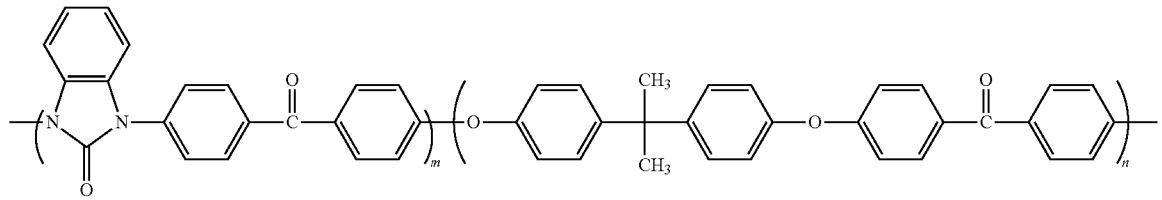

wherein the molar ratios of m:n is from 30:70 to 50:50 and the glass transition temperature is from 170° C. to 200° C.; and a polyketone copolymer of 2H-benzimidazol-2-one and hydroquinone with 4,4'-difluorobenzophenone:

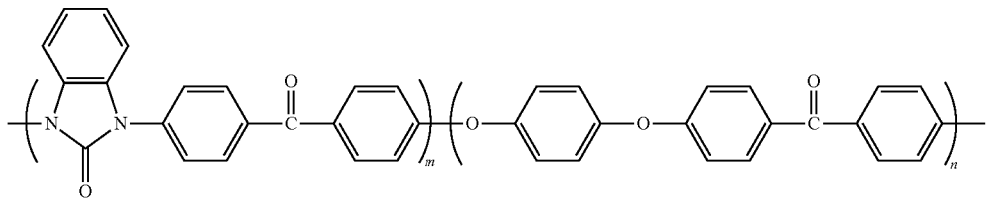

wherein the molar ratios of m:n is from 12.5:87.5 to 30:70 and the glass transition temperature is from 163° C. to 186° C.;

and a polyketone copolymer of 2H-benzimidazol-2-one and 4,4'-biphenol with 4,4'-difluorobenzophenone:

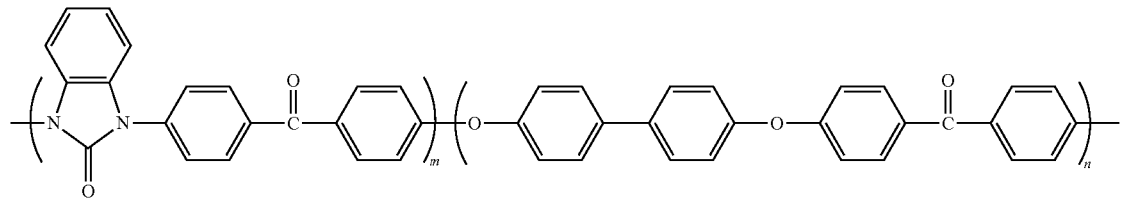

wherein the molar ratios of m:n is from 30:70 to 70:30 and the glass transition temperature is from 217° C. to 235° C.

Chinese Patent CN103450478B teaches a polyketone homopolymer of 2H-benzimidazol-2-one and 4,4'-difluorobenzophenone with glass transition temperature of 226° C.

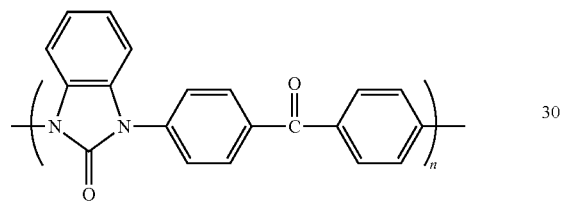

Due to the relatively low glass transition temperatures, these polyketone polymers from 2H-benzimidazol-2-one will have limited applications.

In U.S. Pat. No. 8,609,801, Hay et al also disclose a polysulfone copolymer of 2H-benzimidazol-2-one and bisphenol-A with bis(4-fluorophenyl)sulfone:

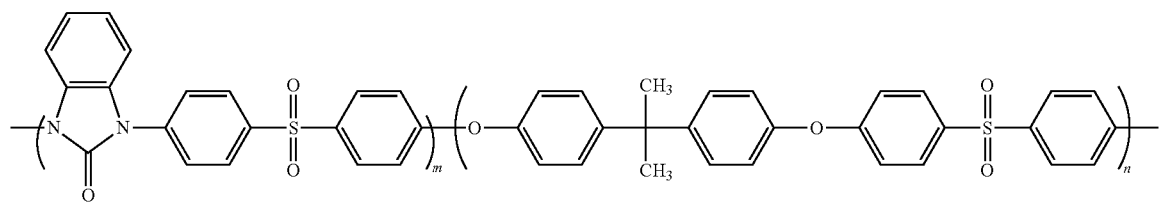

wherein the molar ratios of m:n is from 30:70 to 70:30 and the glass transition temperature is from 225° C. to 283° C.;

and a polysulfone copolymer of 2H-benzimidazol-2-one and 4,4'-biphenol with bis(4-fluorophenyl)sulfone:

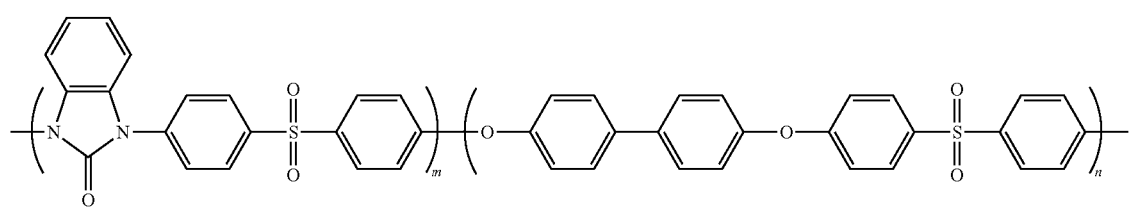

wherein the molar ratios of m:n is from 30:70 to 70:30 and the glass transition temperature is from 269° C. to 315° C.

Bis(4-fluorophenyl)sulfone is not commercially available and is an expensive reagent. These polysulfone copolymers can not be produced commercially using bis(4-fluorophenyl)sulfone as raw material.

Hay et al disclose the use of commercially available bis(4-chlorophenyl)sulfone to produce these polysulfone copolymers, however, cesium carbonate is employed as base for the polymerization reaction. Cesium carbonate is made from cesium metal which is an expensive alkali metal with limited supply. Thus these polysulfone copolymers cannot be produced economically with bis(4-chlorophenyl)sulfone and cesium carbonate as raw materials.

In an effort to produce these polysulfone copolymers economically using bis(4-chlorophenyl)sulfone as raw material, Hay et al disclose a two-step synthesis method using sulfolane as solvent. In the two-step process, 2H-benzimidazol-2-one was first reacted with large excess amount of bis(4-chlorophenyl)sulfone to form 4-chlorophenylsulfone end-capped oligomers:

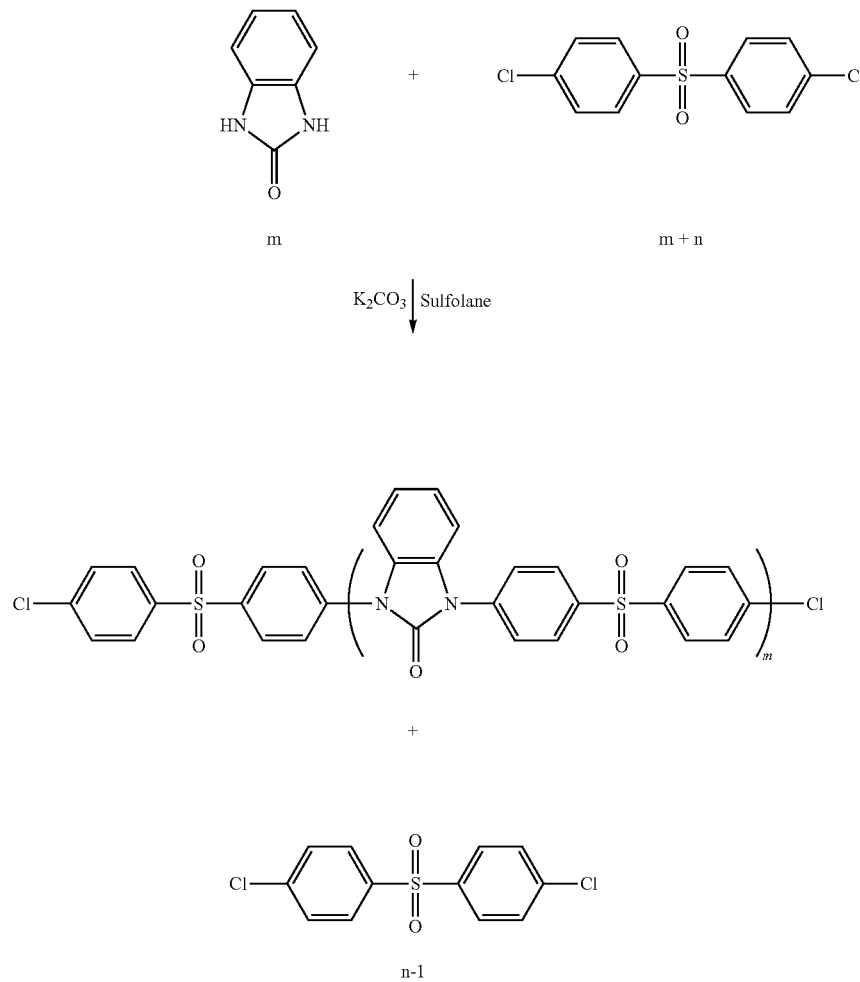

The formed oligomers are then reacted with 4,'4-biphenol to form polysulfone copolymer at temperatures of 215-220° C.:

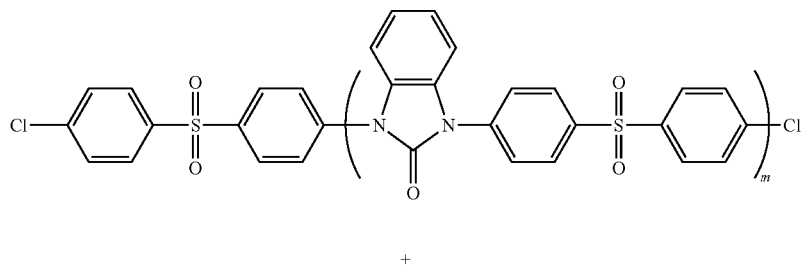

-continued

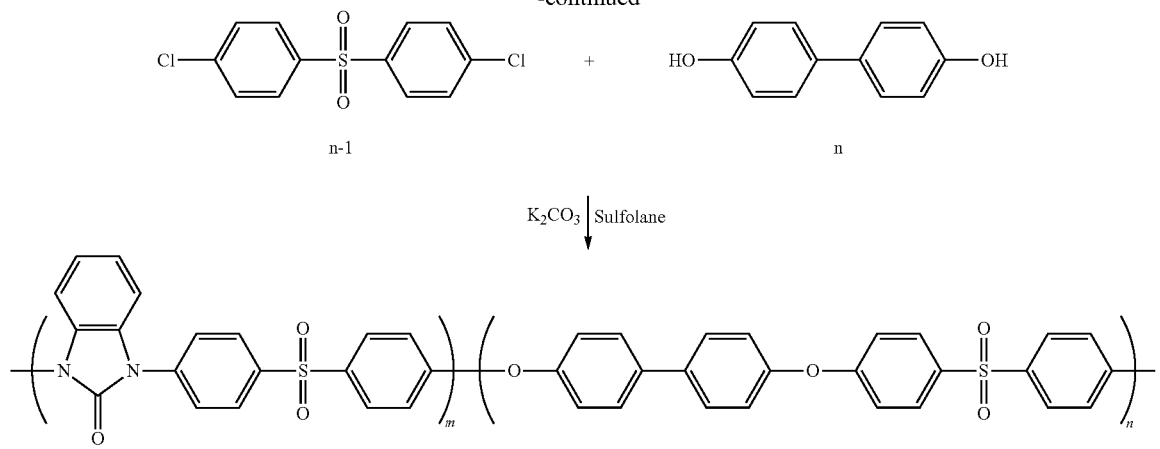

However, with the same m:n ratio, the polysulfone copolymer from the two-step method with bis(4-chlorophenyl)sulfone as raw material (Example 11) has much lower glass transition temperature ($T_g$) than the polysulfone copolymer from one-step method with bis(4-fluorophenyl)sulfone as raw material (Example 4) or one-step method with bis(4-chlorophenyl)sulfone and cesium carbonate as raw materials (Example 9) as illustrated in Table 1. The inherent viscosity of the polysulfone copolymer from Example 11 is also low and the polymer likely has poor mechanical properties and limited practical use.

TABLE 1

Summary of Examples 4, 9 and 11 from U.S. Pat. No. 8,609,801

| Example | Composition (m:n) | Synthesis Method | Raw Material | Glass Transition Temperature | Inherent Viscosity |
| --- | --- | --- | --- | --- | --- |
| Example 4 | 30:70 | One-step | Bis(4-fluorophenyl)sulfone | 269° C. | 1.31 dL/g |
| Example 9 | 30:70 | One-step | Bis(4-chlorophenyl)sulfone + cesium carbonate | 263° C. | 0.67 dL/g |
| Example 11 | 30:70 | Two-step | Bis(4-chlorophenyl)sulfone | 244° C. | 0.31 dL/g |

It would be desirable to develop improved polysulfone polymer compositions that can be manufactured economically and can be used to extend the range of applications over those currently in use. The expanded application areas require the polysulfones to have higher glass transition temperatures, improved flame resistance, preferably without losing chemical resistance, thermal properties, and mechanical properties. Such materials are expected to find enhanced utility in the automotive, food storage, medical device and instruments, water processing, airplanes, consumer electronics and microelectronics applications.

BRIEF SUMMARY OF THE INVENTION

Briefly, one embodiment of the present invention is a polymeric composition comprising a polysulfone copolymer having at least two recurring units selected from the group of recurring units consisting of a first recurring unit formula, formula I:

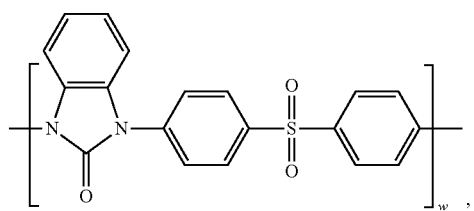

a second recurring unit of formula, formula II:

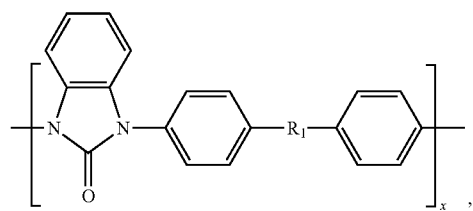

a third recurring unit of formula, formula III:

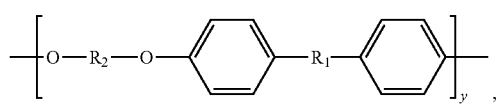

and a fourth recurring unit of formula, formula IV:

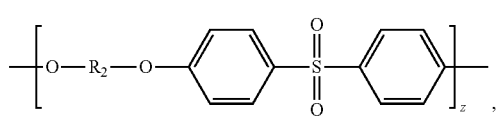

wherein $R_1$ is divalent radical selected from the group consisting of:

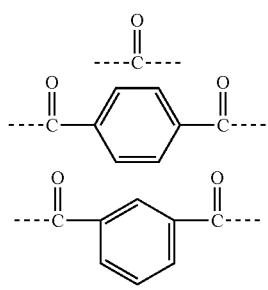

wherein $R_2$ is divalent radical selected from the group consisting of:

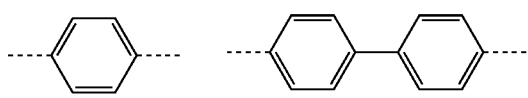

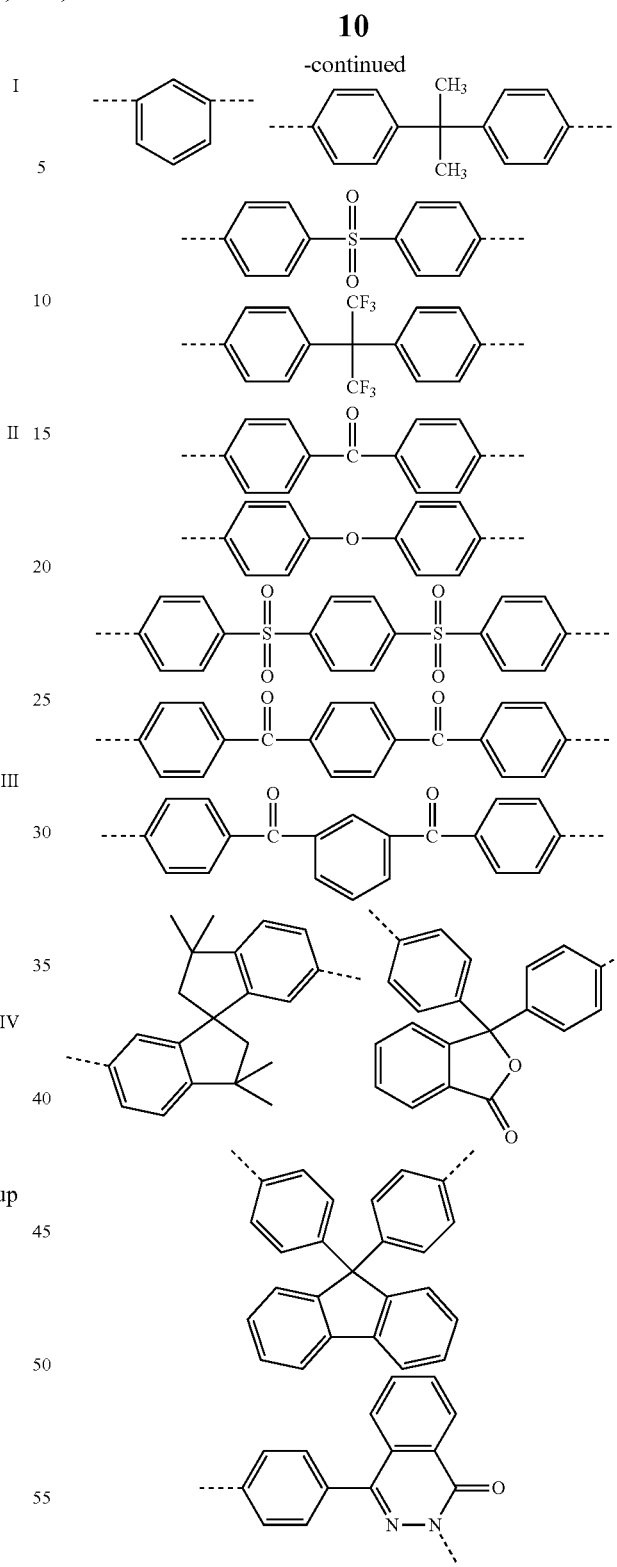

Another embodiment of the invention is a method of producing a polysulfone polymeric composition. The method comprises: reacting 2H-benzimidazol-2-one with large excess of bis(4-chlorophenyl)sulfone in the present of alkali metal carbonate and a polar aprotic solvent at elevated temperature for a short period of time, followed by adding a small amount of difluoro aromatic ketone monomer to react with any 2H-benzimidazol-2-one terminated oligomers and residual 2H-benzimidazol-2-one and convert them into oligomers having mono-fluoro aromatic ketone as end-groups, followed by reacting the mono-fluoro aromatic ketone end-capped oligomers and 4-chlorophenylsulfone end-capped oligomers with bisphenol monomer(s) to form polysulfone copolymer in present of alkali metal carbonate at temperatures below or above the boiling point of a polar aprotic solvent.

Various other features, aspects, and advantages of the present invention will become more apparent with reference to the following description and appended claims.

DETAILED DESCRIPTION AND DEFINITION OF TERMS

Definition of Terms

Figure 1:
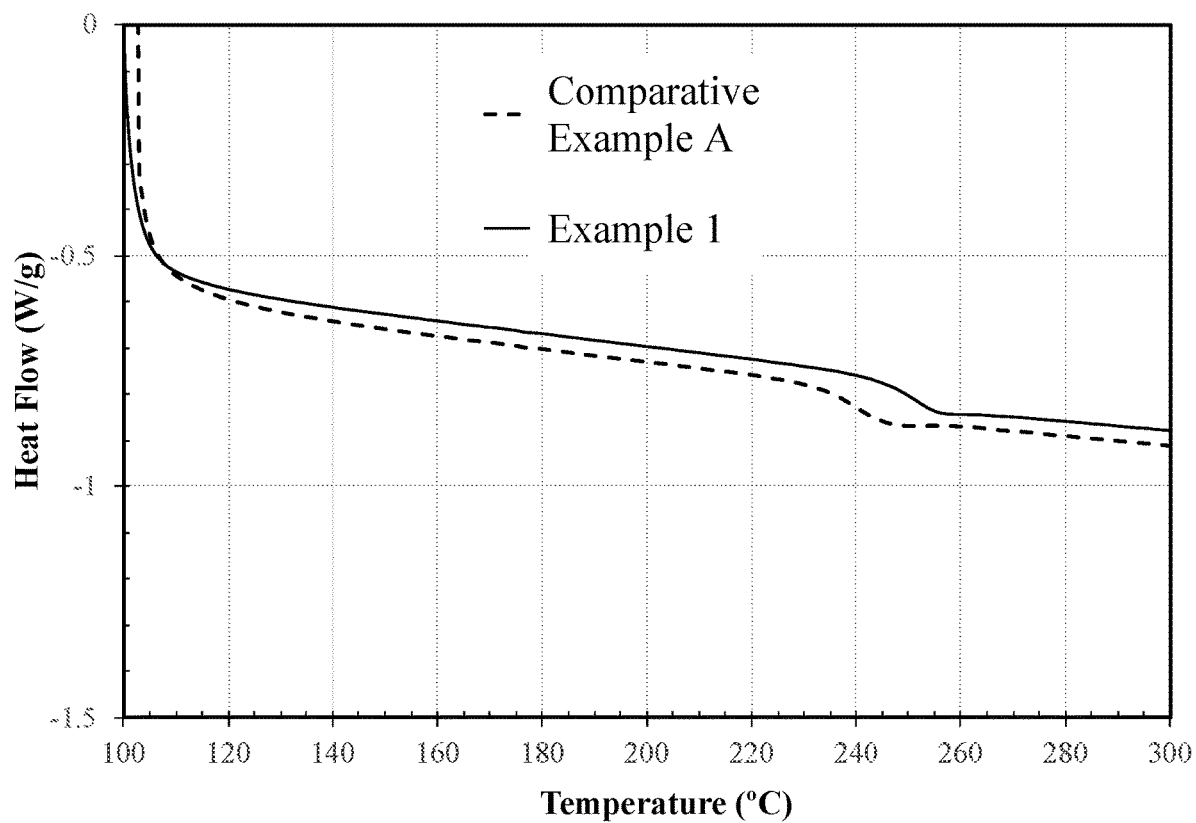
FIG. 1 is a graphical plot of DSC heating scan curve at 20° C./minute for the polysulfone copolymer of Example 1 and the polysulfone copolymer of Comparative Example A.

As referred to in this application, the following definition and terms are used:

"DSC" means Differential Scanning calorimetry (DSC) which is an analytical technique used to investigate the response of polymers to heating. DSC is used to study the glass transition, melting and crystallization of polymers.

"TGA" means Thermogravimetric Analysis (TGA) which is conducted to measure weight changes of polymers as a function of temperature and time. The weight changes of polymeric materials can be caused by decomposition and oxidation reactions. TGA is used to study the weight loss of polymer due to degradation/decomposition and oxidation at elevated temperature in nitrogen atmosphere and oxygen atmosphere.

"Copolymer" means polymer made from three or more monomers via a polycondensation reaction, preferably made from a bisphenol or bisphenol equivalent compound with bis(4-chlorophenyl)sulfone compound and dihalo aromatic ketone compound.

"$T_g$" means glass transition temperature from second DSC heating scan at 20° C./minute after cooling from melt.

"Amorphous" means a polymer with no detectable crystallization temperature $T_c$ from first DSC cooling scan at 20° C./minute from melt and no detectable melting temperature $T_m$ from second DSC heating scan.

"IV" means inherent viscosity measured at 0.5 wt/vol % in NMP at 30° C. expressed in dL/g using a Cannon-Fenske capillary, size 200.

"TGA-5%" means the temperature at which the polymer loses 5% weight in TGA analysis under nitrogen atmosphere.

"Fluoropolymer" means any polymer having at least one fluorine atom contained within the repeating unit of the polymer structure.

The terms 2H-benzimidazol-2-one and 2H-benzimidazolone are used interchangeably herein.

The words repeating and recurring are used interchangeably herein.

The words monomer and compound are used interchangeably herein.

Description of the Invention

As discussed in the prior art, in U.S. Pat. No. 8,609,801, Hay et al disclose a two-step method for synthesis of 2H-bezimidazol-2-one containing polysulfone copolymer using bis(4-chlorophenyl)sulfone and 4,4'-biphenol as co-monomers.

Step 1: Oligomerization Reaction of 2H-bezimidazol-2-one with Large Excess of bis(4-chlorophenyl)sulfone in sulfolane at Elevated Temperature in Present of potassium carbonate

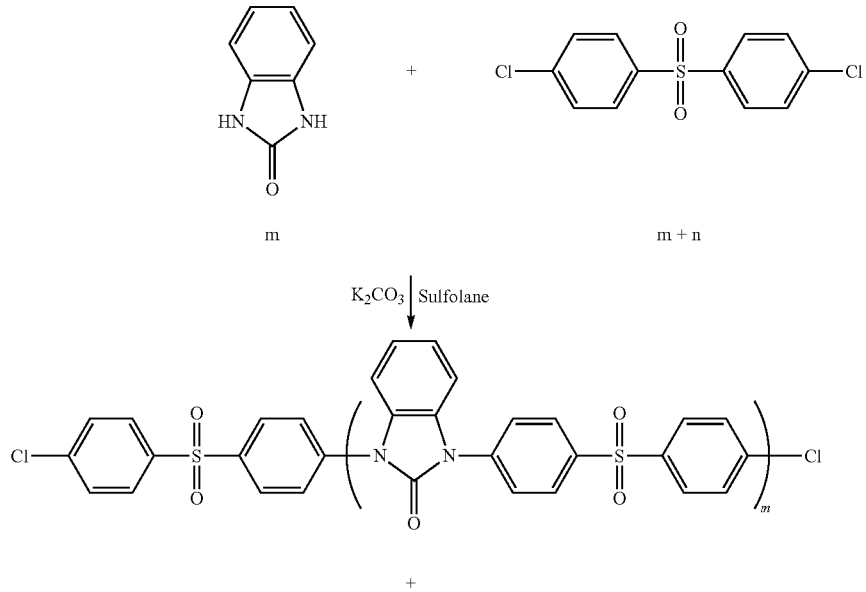

-continued

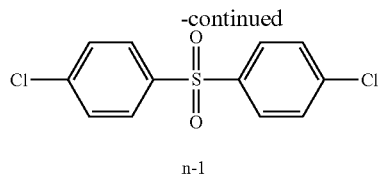

n-1

Step 2: Polymerization Reaction of the 4-chlorophenylsulfone-Terminated Oligomers and Un-Reacted bis(4-chlorophenyl)sulfone with 4,4'-biphenol in sulfolane at Elevated Temperature in Present of potassium carbonate

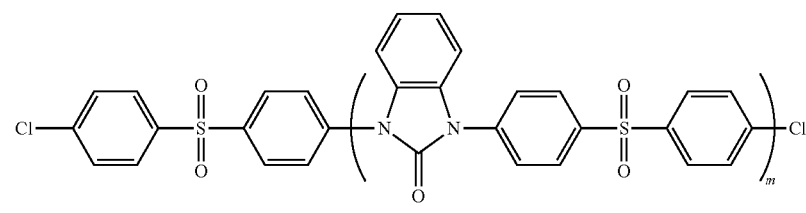

+

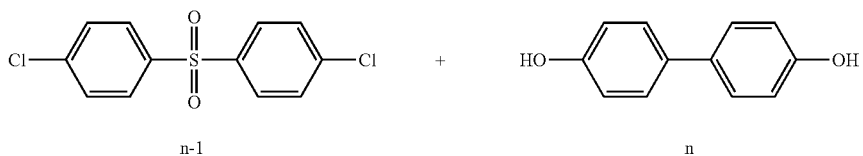

$K_2CO_3$ | Sulfolane

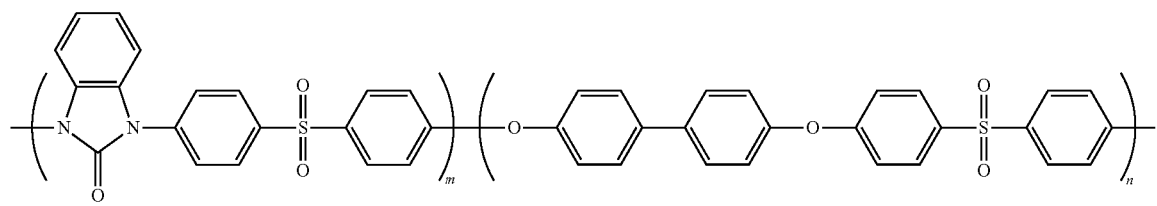

However, with the same m:n ratio (30:70), the polysulfone copolymer from the two-step method with bis(4-chlorophenyl)sulfone as raw material (Example 11) has a much lower glass transition temperature ($T_g$) ($T_g$ of 244° C.) than the polysulfone copolymer from one-step method with bis(4-fluorophenyl)sulfone as raw material (Example 4) ($T_g$ of 269° C.) or one-step method with bis(4-chlorophenyl) sulfone and cesium carbonate as raw materials (Example 9) ($T_g$ of 263° C.) as illustrated in Table 1. The inherent viscosity of the polysulfone copolymer from Example 11 is also low, as a consequence the polymer likely has poor mechanical properties and limited practical use.

To overcome this problem, the applicant has developed a novel three-step synthesis method with addition of a small amount of difluoro aromatic ketone monomer during the oligomerization stage of reaction. This three-step synthesis method can be illustrated as following:

Step 1: Reaction of 2H-bezimidazol-2-one with the Total Amount of bis(4-chlorophenyl)sulfone as Required for a polysulfone Copolymer Formulation in a Polar Aprotic Solvent at Elevated Temperature in Present of potassium carbonate to Form Oligomers as Illustrated in Scheme 1:
Scheme 1
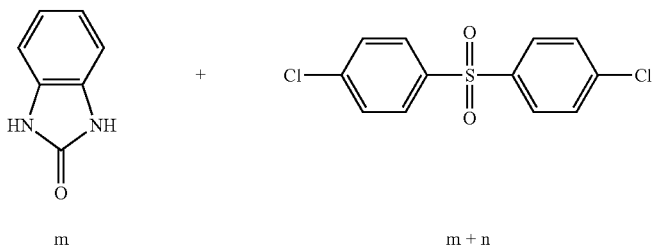
$K_2CO_3$ | Solvent
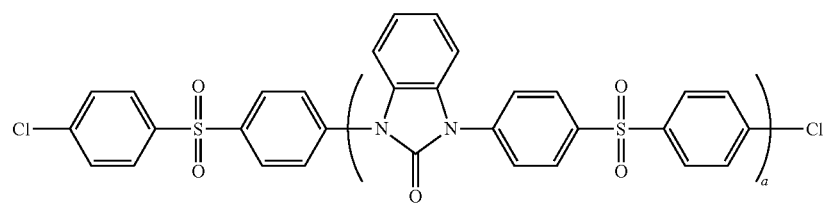
+
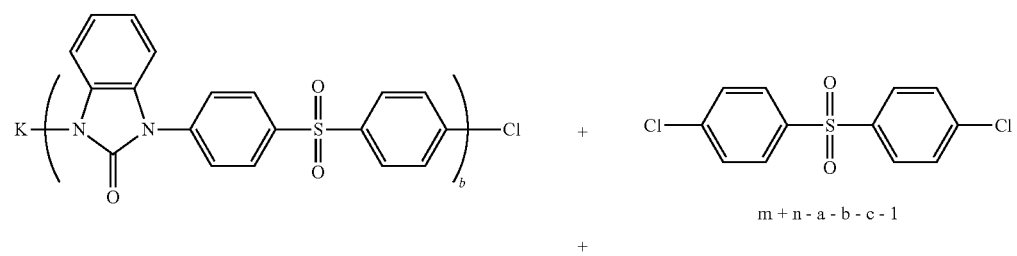
+
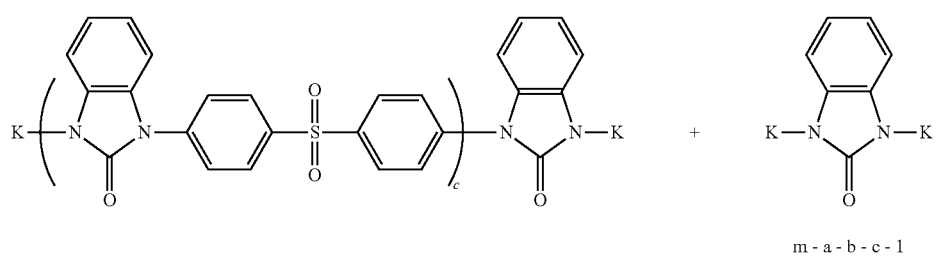

Step 2: Reaction of Un-Reacted and/or Residual Potassium Salt of 2H-bezimidazol-2-one Group in the Oligomers with a Small Amount of difluoro Aromatic Ketone at Elevated Temperature to form mono-fluoro Aromatic Ketone Terminated Oligomers as Illustrated in Scheme 2:
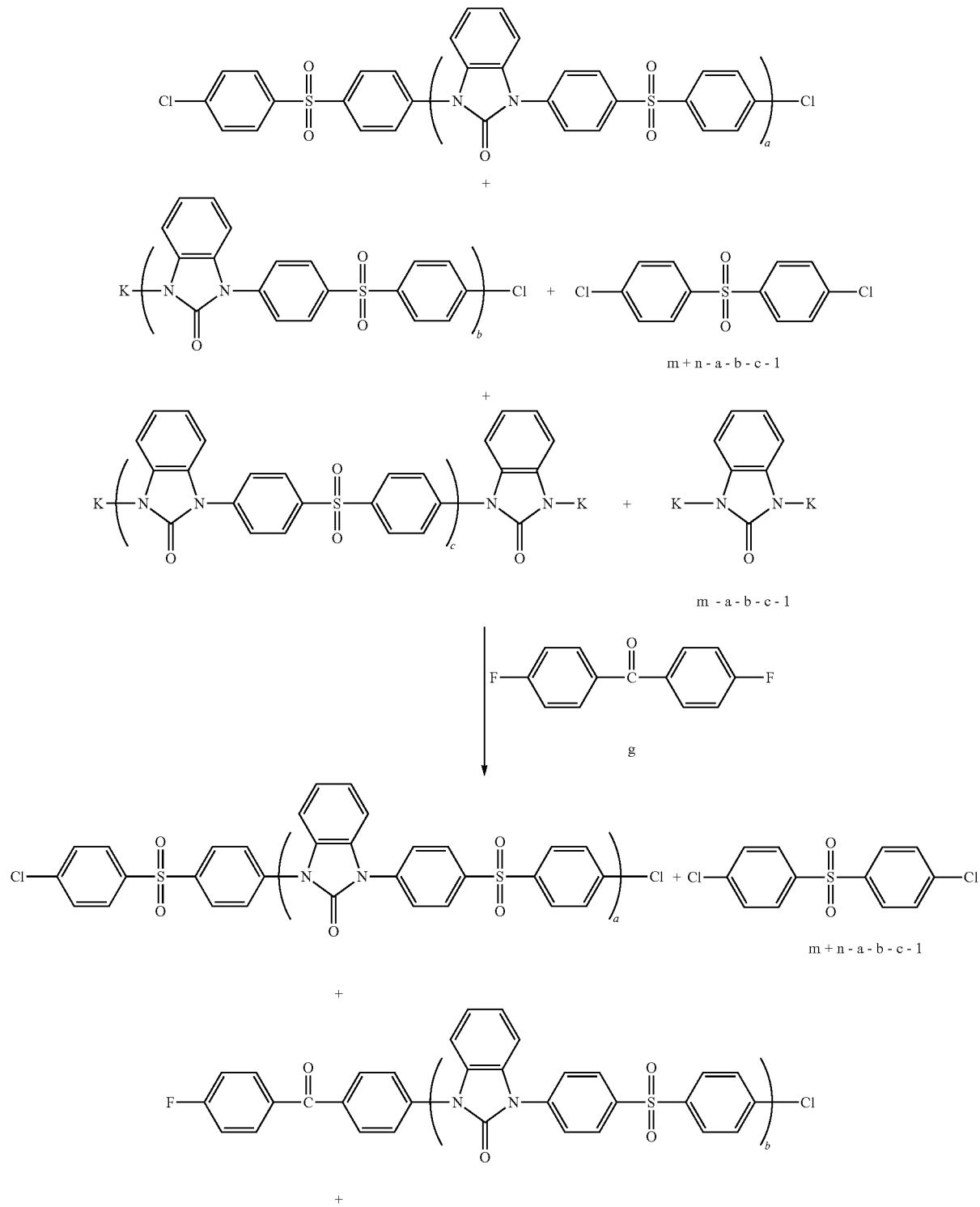

-continued
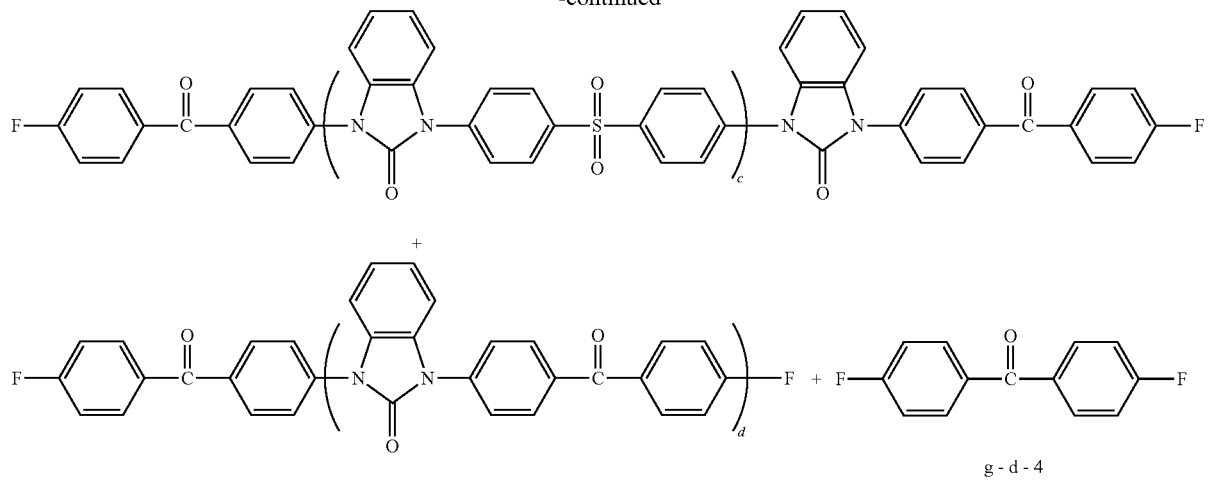
g - d - 4
Step 3: Reactions of the Formed Oligomers, Un-Reacted bis(4-chlorophenyl)sulfone and any Residual of difluoro Aromatic Ketone with a bisphenol in a Polar Aprotic Solvent at Elevated Temperature in Present of potassium carbonate to Form High Molecular Weight Copolymer as Illustrated in Scheme 3:
Scheme 3
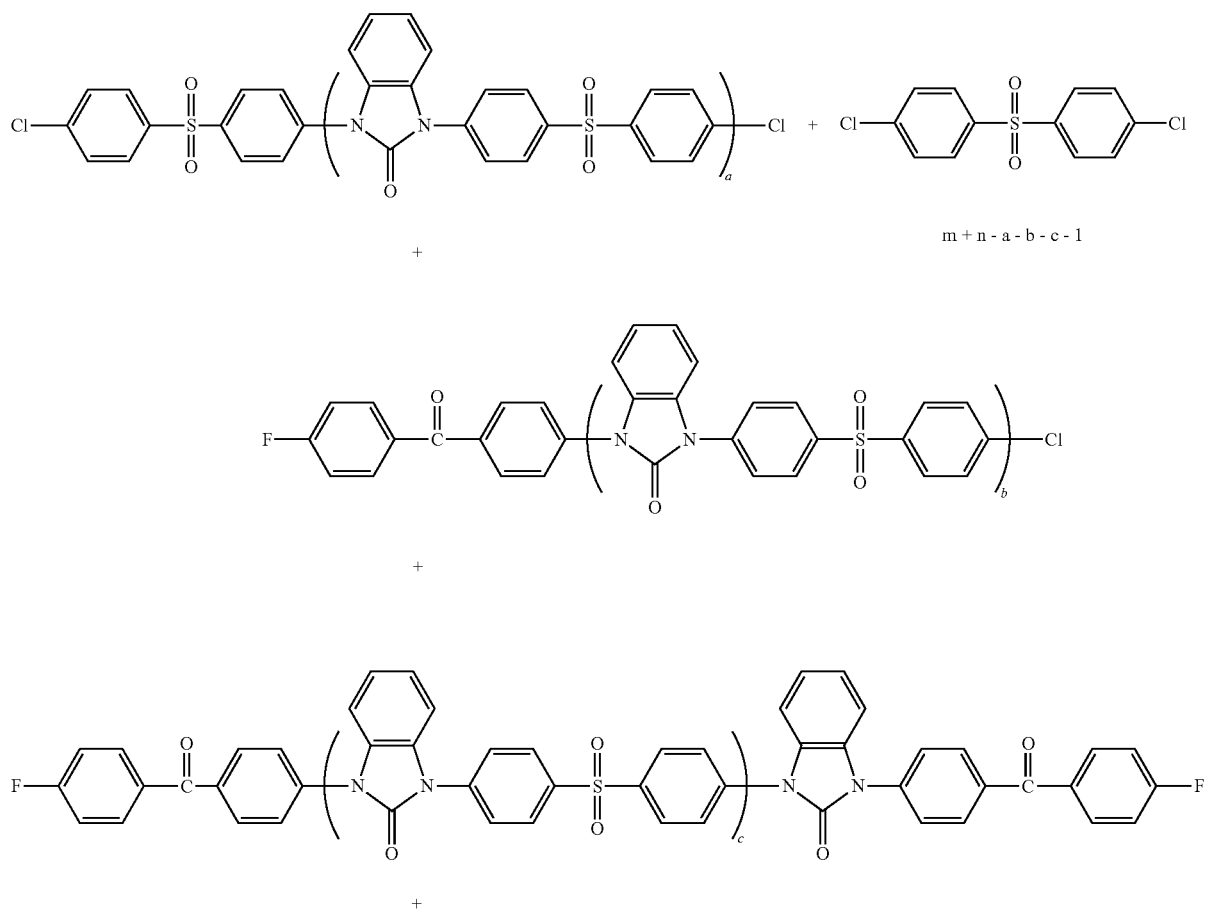
m + n - a - b - c - 1

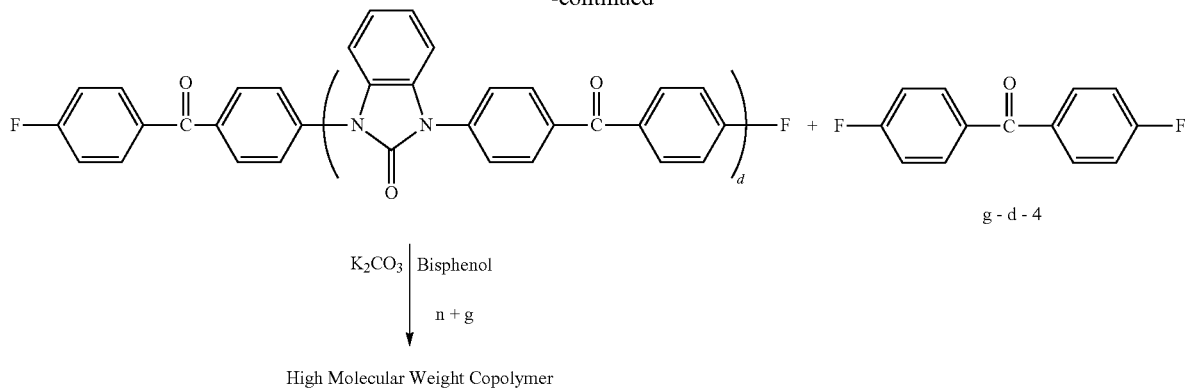

K₂CO₃ | Bisphenol n + g

High Molecular Weight Copolymer

This novel three-step synthesis with addition of a small amount of difluoro aromatic ketone monomer results in a copolymer of polysulfone having aromatic ketone linkage or aromatic ketone segment. The resulting copolymer surprisingly has higher glass transition temperature, improved thermal stability and flame resistance (with higher temperature of TGA-5%, and higher residue or char content at 800° C. after TGA analysis).

Various embodiments of the present invention have many advantages, including the production of polysulfone polymeric compositions that have high glass transition temperatures and improved flame resistance to expand the areas in which the poly(aryl ether sulfone)s can be applied.

The polysulfone polymeric compositions of the invention have at least two recurring units selected from the group of recurring units consisting of a first recurring unit formula, formula I:

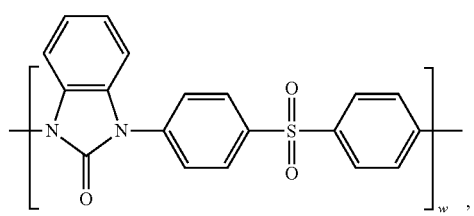

a second recurring unit of formula, formula II:

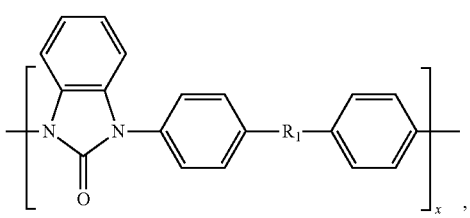

a third recurring unit of formula, formula III:

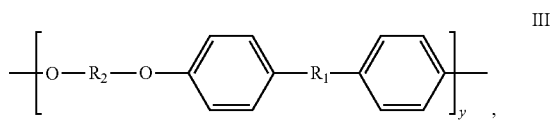

and a fourth recurring unit of formula, formula IV:

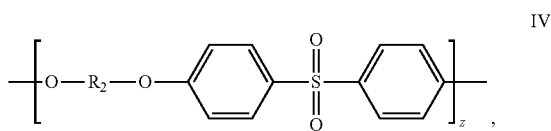

wherein $R_1$ is divalent radical selected from the group consisting of:

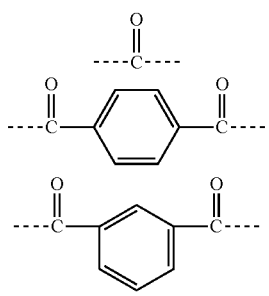

wherein $R_2$ is divalent radical selected from the group consisting of:

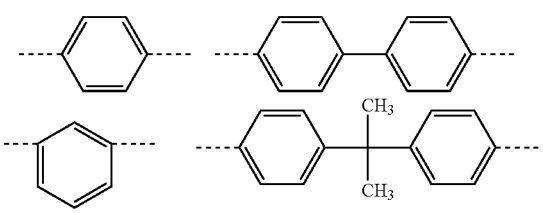

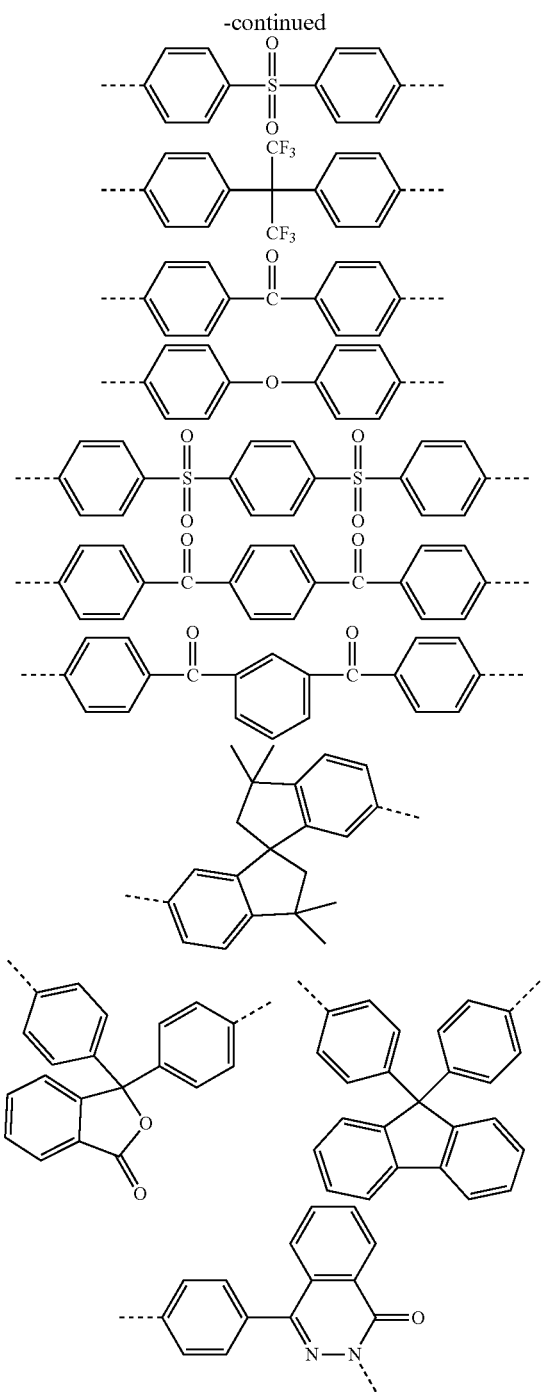

wherein the value of the subscript w ranges from 1 to 5000, the value of the subscript x ranges from 1 to 5000, the value of the subscript y ranges from 0 to 5000, the value of the subscript z ranges from 0 to 5000, subject to the limitation that the ratio of (w+x):(y+z) ranges from 100:0 to 1:99

In one aspect of the invention, there is provided a polysulfone copolymer having a repeating unit of formula I, a repeating unit of formula II, a repeating unit of formula III and a repeating unit of formula IV, wherein the value of subscript w ranges from 1 to 5000, the value of the subscript x ranges from 1 to 50, the value of subscript y ranges from 0 to 50, the value of subscript z ranges from 1 to 5000, subject to limitation that the ratio of (w+x):(y+z) ranges from 99:1 to 1:99, and the ratio of (w+z):(x+y) ranges from 99.95:0.05 to 60:40.

In another aspect of the invention, there is provided a polysulfone copolymer having a repeating unit of formula I, a repeating unit of formula II, a repeating unit of formula III and a repeating unit of formula IV, wherein the ratio ((I+II):(III+IV)) of the sum (I+II) of repeating unit of formula I and repeating unit of formula II and the sum (III+IV) of repeating unit of formula III and repeating unit of formula IV preferably ranges from 95:5 to 5:95, more preferably ranges from 85:15 to 15:85 and further preferably ranges from 70:30 to 30:70.

In another aspect of the invention, there is provided a polysulfone copolymer having a repeating unit of formula I, a repeating unit of formula II, a repeating unit of formula III and a repeating unit of formula IV, wherein the ratio ((I+IV):(II+III)) of the sum (I+IV) of repeating unit of formula I and repeating unit of formula IV and the sum (II+III) of repeating unit of formula II and repeating unit of formula III preferably ranges from 99.95:0.05 to 65:35, more preferably ranges from 99.5:0.5 to 85:15 and further preferably ranges from 99.0:1.0 to 90:10.

In another aspect of the invention, there is provided a polysulfone copolymer having a repeating unit of formula I, a repeating unit of formula II, a repeating unit of formula III and a repeating unit of formula IV, wherein the ratio ((I+II):(III+IV)) of the sum (I+II) of repeating unit of formula I and repeating unit of formula II and the sum (III+IV) of repeating unit of formula III and repeating unit of formula IV is suitably in the range of 10:90 to 55:45, and the ratio ((I+IV):(II+III)) of the sum (I+IV) of repeating unit of formula I and repeating unit of formula IV and the sum (II+III) of repeating unit of formula II and repeating unit of formula III is suitably in the range of 99.5:0.5 to 70:30.

In another aspect of the invention, there is provided a polysulfone copolymer having a repeating unit of formula I, a repeating unit of formula II, a repeating unit of formula III and a repeating unit of formula IV, wherein the ratio of (w+z):(x+y) is greater than 1.5, preferably greater than 10, more preferably greater than 15, further preferably greater than 30.

In another aspect of the invention, there is provided a polysulfone copolymer having a repeating unit of formula I, a repeating unit of formula II, a repeating unit of formula III and a repeating unit of formula IV, wherein the value of the subscript w ranges from 1 to 5000, the value of the subscript x is 1, the value of the subscript y is 1, the value of the subscript z ranges from 1 to 5000, and subject to the limitation that the ratio of w:z ranges from 1:99 to 99:1.

In another aspect of the invention, there is provided a polysulfone copolymer having a repeating unit of formula I and a repeating unit of formula II, wherein the subscript w ranges from 1 to 5000, the value of the subscript x ranges from 1 to 5000, and subject to the limitation that the ratio of w:x ranges from 99:1 to 1:99.

In another aspect of the invention, there is provided a polysulfone copolymer having a repeating unit of formula I and a repeating unit of formula II, wherein the ratio of w:x preferably ranges from 95:5 to 5:95, more preferably ranges from 90:10 to 60:40, further preferably ranges from 85:15 to 70:30.

In another aspect of the invention, there is provided a polysulfone copolymer having a repeating unit of formula I, a repeating unit of formula II, a repeating unit of formula III and a repeating unit of formula IV, wherein $R_1$ is divalent radical selected as

$R_2$ is divalent radical selected as

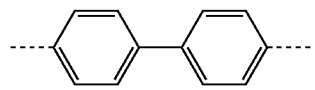

and said copolymer has a glass transition temperature $T_g$ of greater than 220° C., preferably greater than 230° C., more preferably greater than 240° C. and further preferably greater than 250° C.

In another aspect of the invention, there is provided a polysulfone copolymer having a repeating unit of formula I, a repeating unit of formula II, a repeating unit of formula III and a repeating unit of formula IV, wherein $R_1$ is divalent radical selected as

$R_2$ divalent radical is selected as

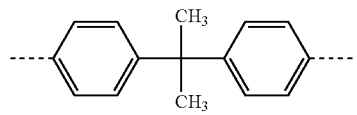

and said copolymer has a glass transition temperature $T_g$ of greater than 190° C., preferably greater than 200° C., more preferably greater than 210° C. and further preferably greater than 220° C.

In another aspect of the invention, there is provided a polysulfone copolymer having a repeating unit of formula I, a repeating unit of formula II, a repeating unit of formula III and a repeating unit of formula IV, wherein $R_1$ is divalent radical selected as

$R_2$ is divalent radical selected as

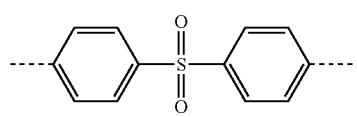

and said copolymer has a glass transition temperature $T_g$ of greater than 220° C., preferably greater than 230° C., more preferably greater than 240° C. and further preferably greater than 250° C.

In another aspect of the invention, there is provided a polysulfone copolymer having a repeating unit of formula I, a repeating unit of formula II, a repeating unit of formula III and a repeating unit of formula IV, wherein $R_1$ is divalent radical selected as

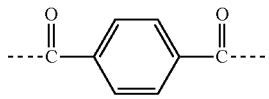

$R_2$ is divalent radical selected as

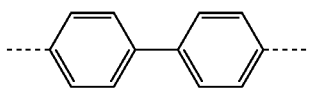

and said copolymer has a glass transition temperature $T_g$ of greater than 220° C., preferably greater than 230° C., more preferably greater than 240° C. and further preferably greater than 250° C.

In another aspect of the invention, there is provided a polysulfone copolymer having a repeating unit of formula I, a repeating unit of formula II, a repeating unit of formula III and a repeating unit of formula IV, wherein $R_1$ is divalent radical selected as

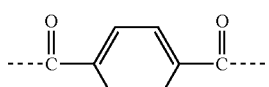

$R_2$ is divalent radical selected as

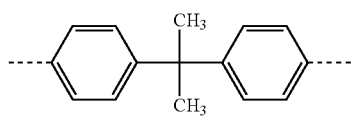

and said copolymer has a glass transition temperature $T_g$ of greater than 190° C., preferably greater than 200° C., more preferably greater than 210° C. and further preferably greater than 220° C.

In another aspect of the invention, there is provided a polysulfone copolymer having a repeating unit of formula I, a repeating unit of formula II, a repeating unit of formula III and a repeating unit of formula IV, wherein $R_1$ is divalent radical selected as

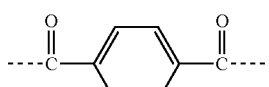

$R_2$ is divalent radical selected as

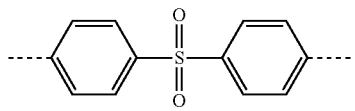

and said copolymer has a glass transition temperature $T_g$ of greater than 220° C., preferably greater than 230° C., more preferably greater than 240° C. and further preferably greater than 250° C.

In another aspect of the invention, there is provided a polysulfone copolymer having a repeating unit of formula I, a repeating unit of formula II, a repeating unit of formula III and a repeating unit of formula IV, wherein $R_1$ is divalent radical selected as

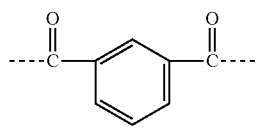

$R_2$ is divalent radical selected as

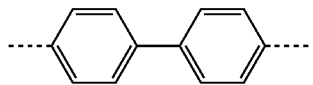

and said copolymer has a glass transition temperature $T_g$ of greater than 220° C., preferably greater than 230° C., more preferably greater than 240° C. and further preferably greater than 250° C.

In another aspect of the invention, there is provided a polysulfone copolymer having a repeating unit of formula I, a repeating unit of formula II, a repeating unit of formula III and a repeating unit of formula IV, wherein $R_1$ is divalent radical selected as

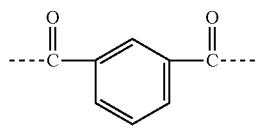

$R_2$ is divalent radical selected as

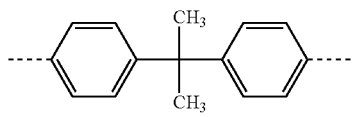

and said copolymer has a glass transition temperature $T_g$ of greater than 190° C., preferably greater than 200° C., more preferably greater than 210° C. and further preferably greater than 220° C.

In another aspect of the invention, there is provided a polysulfone copolymer having a repeating unit of formula I, a repeating unit of formula II, a repeating unit of formula III and a repeating unit of formula IV, wherein $R_1$ is divalent radical selected as

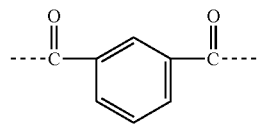

$R_2$ is divalent radical selected as

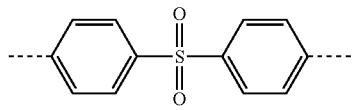

and said copolymer has a glass transition temperature $T_g$ of greater than 220° C., preferably greater than 230° C., more preferably greater than 240° C. and further preferably greater than 250° C.

In another aspect of the invention, there is provided a polysulfone copolymer having a repeating unit of formula I, a repeating unit of formula II, a repeating unit of formula III and a repeating unit of formula IV, wherein $R_1$ is a mixture of divalent radical selected from at least two of the group consisting of:

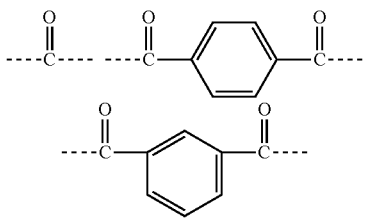

and said copolymer has a glass transition temperature $T_g$ of greater than 190° C., preferably greater than 200° C., more preferably greater than 230° C. and further preferably greater than 250° C.

In still another aspect of the invention, there is provided a polysulfone copolymer having a repeating unit of formula I and a repeating unit of formula II, wherein $R_1$ is divalent radical selected as

and said copolymer has a glass transition temperature $T_g$ of greater than 240° C. and less than 350° C.

In still another aspect of the invention, there is provided a polysulfone copolymer having a repeating unit of formula I and a repeating unit of formula II, wherein $R_1$ is divalent radical selected as

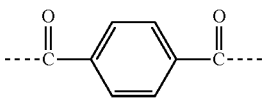

and said copolymer has a glass transition temperature $T_g$ of greater than 240° C. and less than 350° C.

In still another aspect of the invention, there is provided a polysulfone copolymer having a repeating unit of formula I and a repeating unit of formula II, wherein $R_1$ is divalent radical selected as

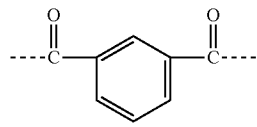

and said copolymer has a glass transition temperature $T_g$ of greater than 240° C. and less than 350° C.

In another aspect of the invention, there is provided a polysulfone copolymer having a repeating unit of formula I, and a repeating unit of formula II, wherein $R_1$ is a mixture of divalent radical selected from at least two of the group consisting of:

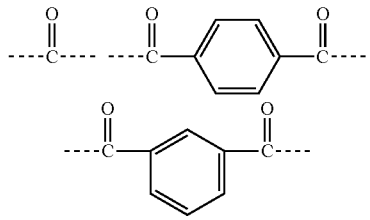

and said copolymer has a glass transition temperature $T_g$ of greater than 240° C. and less than 350° C.

In still another aspect of the invention, there is provided a polysulfone copolymer having a $T_g$ of about 190° C. to about 345° C., preferably a $T_g$ of about 200° C. to about 310° C., more preferably a $T_g$ of about 210° C. to about 290° C., most preferably a $T_g$ of about 220° C. to about 270° C. The $T_g$ is preferably in the range of 200° C. to 320° C.

DSC may be used to examine a 10±2 mg sample of polysulfone copolymer in a TA Instruments DSC Q2000 under nitrogen at a flow rate of 40 ml/min. The scan procedure may be:
Step 1: Perform a preliminary thermal cycle by heating the sample from 50° C. to 400° C. at 20° C./minute
Step 2: Hold at 400° C. for 3 minutes
Step 3: Cool to 50° C. at 20° C./minute
Step 4: Heat from 50° C. to 400° C. at 20° C./minute, record $T_g$ From the resulting second heating scan the onset of the $T_g$ may be obtained as the intersection of lines drawn along the pretransition baseline and a line drawn along the greatest slope obtained during the transition.

In still another aspect of the invention, there is provided a polysulfone copolymer having improved thermal stability and flame resistance.

Thermogravimetry (TGA) may be used to examine the thermal stability of the polysulfone copolymer. TGA analysis is performed on a TA Instrument TGA55 at a heating rate of 20° C./minute under nitrogen atmosphere (flow rate of 200 ml/minute), TGA-5% is reported as temperature at which 5% weight loss is observed, and residue or char content at 800° C. is reported.

In still another aspect of the invention, there is provided a polysulfone copolymer having an inherent viscosity (IV) of about 0.30 to about 5.00 dL/g, preferably an inherent viscosity (IV) of about 0.35 to about 3.00 dL/g, more preferably an inherent viscosity (IV) of about 0.40 to about 1.50 dL/g, further preferably an inherent viscosity (IV) of about 0.50 to 1.00 dL/g. The inherent viscosity (IV) is preferably in the range of 0.35 to 3.00 dL/g.

The inherent viscosity of polysulfone copolymer is suitably measured pursuant to ASTM D2857 standard at 30° C. on 0.5 wt/vol % solution in NMP and expressed in dL/g using a Cannon-Fenske capillary, size 200.

The polysulfone copolymers of the present invention may be in powder form with particle size (D90) less than 200 µm. The powder of the said polysulfone copolymer can be used in SLS 3D printing or other rapid prototyping method, in compression molding or in electrostatic or solvent-borne powder coating.

The polysulfone copolymers of the present invention may be in monofilament form with a diameter in a range of 0.1 mm to 5.0 mm. The monofilament of the said polysulfone copolymer can be used in filament fusion fabrication 3D printing or other rapid prototyping method.

The polysulfone copolymers of the present invention can be blended with one or more other polymers which include but not limited to polybenzimidazole, polyarylamides, polysulfones, polyaryletherkones, polyimides, polyamideimide, polyetherimides, polyphenylenesulfides, fluoropolymers, polyamides, polyesters and polycarbonates.

The polysulfone copolymers of the present invention may be part of a composition which may include said polysulfone copolymer and a filler. Said filler may include a fibrous filler or a non-fibrous filler. Said filler may include both a fibrous filler and a non-fibrous filler.

A said fibrous filler may be continuous fiber or discontinuous fiber.

A said fibrous filler may be selected from inorganic fibrous materials, non-melting and high-melting organic fibrous materials, such as aramid fiber, and carbon fiber.

A said fibrous filler may be selected from glass fiber, carbon fiber, silica fiber, alumina fiber, zirconia fiber, boron nitride fiber, silicon nitride fiber, boron fiber, fluoropolymer fiber, aramid fiber, and potassium titanate fiber. Preferred fibrous fillers are glass fiber and carbon fiber.

A fibrous filler may comprise nanofibers.

A said non-fibrous filler may be selected from (i) colorants such as notably a dye, (ii) pigments such as notably titanium dioxide, zinc sulfide and zinc oxide, (iii) light stabilizers, e.g. UV stabilizers, (iv) heat stabilizers, (v) antioxidants such as notably organic phosphites and phosphonites, (vi) acid scavengers, (vii) processing aids, (viii) nucleating agents, (ix) internal lubricants and/or external lubricants, (x) flame retardants, (xi) smoke-suppressing agents, (xii) anti-static agents, (xiii) anti-blocking agents, (xiv) conductivity additives such as notably carbon black, graphite, graphene, metallic filler, and carbon nanofibrils, (xv) plasticizers, (xvi) flow modifiers, (xvii) extenders, (xviii) metal deactivators and combinations comprising one or more of the foregoing non-fibrous fillers.

The non-fibrous fillers may be introduced in the form of powder or flaky particles, and micro powder.

Said composition may define a composite material which could be prepared as described in *Impregnation Techniques for Thermoplastic Matrix Composites*. A Miller and A G Gibson, *Polymer & Polymer Composites* 4(7), 459-481 (1996), the contents of which are incorporated herein by reference. Preferably, in the method, said polysulfone copolymer and said filler means are mixed at an elevated temperature of said polysulfone copolymer. Thus suitably, said polysulfone copolymer and filler means are mixed whilst the polysulfone copolymer is molten. Said elevated temperature is suitably below the decomposition temperature of the polysulfone copolymer. Said elevated temperature is preferably at or above soft temperature for said polysulfone copolymer. Said elevated temperature is preferably at least 300° C. Advantageously, the molten polysulfone copolymer can readily wet the filler and/or penetrate consolidated fillers, such as fibrous mats or woven fabrics, so the composite material prepared comprises the polysulfone copolymer and filler(s) which is substantially uniformly dispersed throughout the polysulfone copolymer.

The composite material may be prepared in a continuous process. In this case the polysulfone copolymer of the present invention and filler(s) may be constantly fed to a location wherein they are mixed and heated. An example of such a continuous process is extrusion. Another example (which may be particularly relevant wherein the filler means comprises a fibrous filler) involves causing a continuous filamentous mass to move through a melt comprising said polysulfone copolymer. The continuous filamentous mass may comprise a continuous length of fibrous filler or, more preferably, a plurality of continuous filaments which have been consolidated at least to some extent. The continuous fibrous mass may comprise a tow, roving, braid, woven fabric or unwoven fabric. The filaments which make up the fibrous mass may be arranged substantially uniformly or randomly within the mass.

Alternatively, the composite material may be prepared in a discontinuous process. In this case, a predetermined amount of said polysulfone copolymer and a predetermined amount of said filler may be selected and contacted and a composite material prepared by causing the polysulfone copolymer to melt and causing the polysulfone copolymer and filler to mix to form a substantially uniform composite material.

The composite material may be formed into a particulate form for example into pellets or granules. Pellets or granules may have a maximum dimension of less than 25 mm, preferably less than 7.5 mm, more preferably less than 5.0 mm.

Preferably, said filler means comprises one or more fillers selected from glass fiber, carbon fiber, carbon black, graphite, graphene, and a fluoropolymer resin. More preferably, said filler means comprises glass fiber or carbon fiber.

A composition or composite material as described may include 10 to 95 wt. % of said polysulfone copolymer and 5 to 90 wt. % of filler. Preferred embodiments include greater than 10 wt. % of filler.

A composition or composite material as described may include 10 to 99 wt. % of the polysulfone copolymer of the invention and 1 to 90 wt. % of fluoropolymers. The fluoropolymer can be selected from polytetrafluoroethylene (PTFE), poly(ethylene-co-tetrafluoroethylene) (PETFE), poly (tetrafluoroethylene-co-hexafluoropropylene) (PFEP), poly(tetrafluoroethylene-co-perfluoro(alkyl vinyl ether)) (PFA), poly(chlorotrifluoroethylene) (PCTFE), poly(tetrafluoroethylene-co-chlorotrifluoroethylene) (PTFE-CTFE), poly(ethylene-co-chlorotrifluoroethylene) (PECTFE), poly (vinylidene fluoride) (PVDF), and mixture thereof. The selected fluoropolymer has a melting temperature in the range of 150° C. to 400° C. Optionally a portion of the fluoropolymers can be derived from micro-powdered fluoropolymer with particle size ranging from 0.01 to 50 μm. The composite material provides many useful properties such as high glass transition temperature, high dielectric strength, low dielectric constant, low loss (digital signal loss and signal integrity), low coefficient of expansion, chemical resistance and ability to bond with metal.

The polysulfone copolymers of the invention, as above detailed, can be processed by usual melt processing techniques, including notably extrusion, injection molding, compression molding, thermoforming, blow molding, rotational molding, coating and additive manufacturing, so as to provide shaped articles.

Due to their high temperature resistance, chemical resistance, good mechanical properties, flame resistance, and ease of fabrication, the polysulfone copolymers of the invention can be shaped into a large variety of articles or parts of articles usable in applications requiring high temperature resistance, good chemical resistance, inherent flame resistance, high stiffness and strength, good impact strength, etc. Therefore, a further aspect of the present invention concerns also an article comprising the polysulfone copolymer as above described or the polymer composition as above described. The polysulfone copolymer and polysulfone copolymer composition comprised in the article according to the present invention have the same characteristics respectively as the copolymer and copolymer composition according to the present invention.

The article of manufacture comprising the polysulfone copolymer of the invention is advantageously an article used in electronics, consumer goods, water processing or purification, automotive, medical, plumbing, and aerospace applications. Non limitative examples thereof are listed below. Among them, the article according to the present invention may notably be membranes, filtration devices, dairy equipment, food service tray, electrical connectors, electrical insulation, frame of eyeglasses, pipe, fitting, manifold and valves, medical instrument case or tray, aircraft interior panel or component, cookware, laboratory animal cage, laboratory equipment, coating and composite.

The said polysulfone copolymer of the present invention alone or in combination with other fillers or polymers such as fluoropolymers can also be extruded or formed into a single layer substrate, or multiplayer structure for electrical or electronics applications, such as, a laminate layer structure in combination with copper clad or other supporting substrate for integrated circuits or the like (e.g., a flexible circuit board), or as a wire wrap for wire, cable or other similar electrical conductor material.

According to certain embodiments, shaped articles are under the form of substantially bidimensional articles, e.g., parts wherein one dimension (thickness or height) is significantly less than the other two characterizing dimensions (width and length), such as notably films, fibers, and sheets.

According to certain embodiments, shaped articles are a substrate, sheet, film, multilayer structure, multilayer sheet, multilayer film, molded part, extruded shape, molded shape, coated part, pellet, powder, foam, fiber, flaked fiber.

According to certain embodiments, shaped article maybe a single layer substrate or film useful for electronic or electrical applications either alone or as a component of multilayer structure, and optionally further comprises a conductive layer disposed on at least one side thereof. The conductive layer is selected from the group consisting of copper, silver, gold, nickel, titanium, and mixtures thereof.

According to certain embodiment, the shaped substrate or film supports or protects an integrated circuit die and further comprises a conductive pathway on a surface, and provides a conductive pathway within or through the substrate.

According to certain embodiment, the shaped substrate or film may be used as a component of an integrated circuit (IC) packaging composition, such as, a chip on lead (COL) package, a chip on flex (COF) package, a lead on chip (LOC) package, optoelectronic package, flat-wire applications, a multi-chip module (MCM) package, a ball grid array (BGA) package, chip scale package (CSP), or a tape automated bonding (TAB) package. Alternatively, the shaped substrate or film can be used as a component of a wafer level integrated circuit package substrate comprising a conductive passageway having one or more of the following: a wire bond, a conductive metal, and a solder bump.

According to other embodiments, the shaped substrate or film may be used in a high speed digital application such as high speed digital antenna, or used in receiving or transmitting microwave signals. "Microwave signals" are intended to mean electromagnetic wavelengths no large than what has historically been referred as "microwave", including wavelengths that are smaller than what has historically been referred to as microwave. The shaped substrate or film may be incorporated into circuit boards, either flexible or rigid. The shaped substrate or film may also be used as all or part of a housing for one or more conductive wires or cables such as a wire or cable wrap or as a housing component of a "flat wire" as commonly use in wiring applications.

According to certain embodiments, shaped articles are provided as three-dimensional parts, e.g., substantially extending in the three dimensions of space in similar manner, including under the form of complex geometries parts, e.g., with concave or convex sections, possibly including undercuts, inserts, and the like.

Another use of the present invention is a method of making a polysulfone copolymer, as above set forth, comprising reacting 2H-benzimidazolone of formula, formula V:

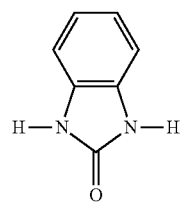

first step with a compound bis(4-chlorophenyl)sulfone, in large excess, of formula, formula VI:

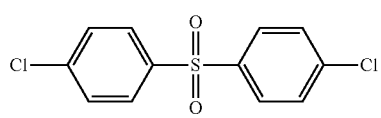

second step with a compound difluoro aromatic ketone or mixture of difluoro aromatic ketone compounds of formula, formula VII:

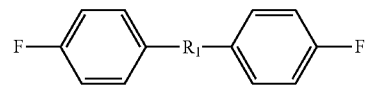

third step reacting with a compound bisphenol or mixture of bisphenol compounds of formula, formula VIII:

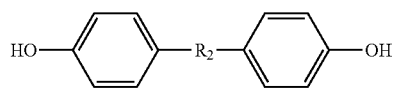

in a molar ratio (V:VIII) of 1:99 to 99:1, a molar ratio (VII:V) of 1:99 to 99:1, a molar ratio (VI: VII) of 99.95:0.05 to 1:99, and in a molar ratio ((VII+VI):(V+VIII)) of 110:100 to 90:100, in a polar aprotic solvent such as dimethylacetamide (DMAc), or dimethylsulfoxide (DMSO), or N-cyclohexyl-2-pyrrolidone (CHP), or N-Methyl-2-pyrrolidone (NMP), or sulfolane or diphenylsulfone, or mixtures thereof at elevated temperature in the presence of an alkali metal carbonate or a mixture of alkali metal carbonate, wherein $R_1$ is divalent radical selected from the group consisting of:

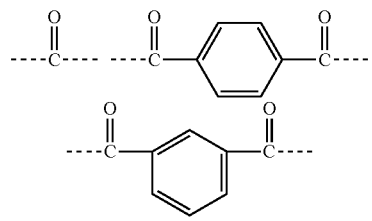

and $R_2$ is divalent radical selected from the group consisting of:

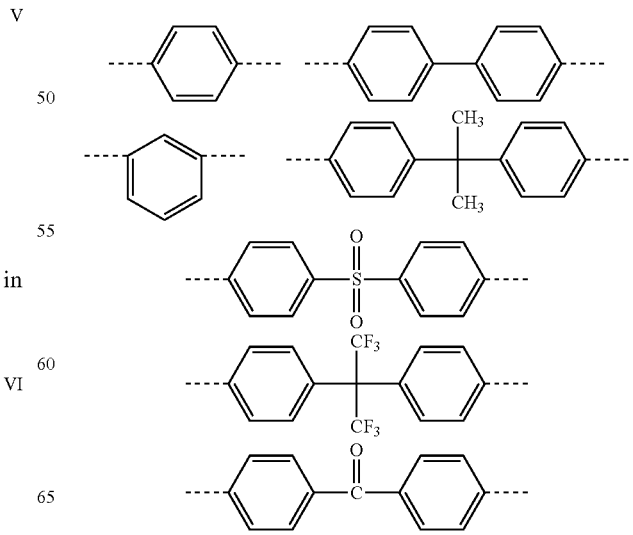

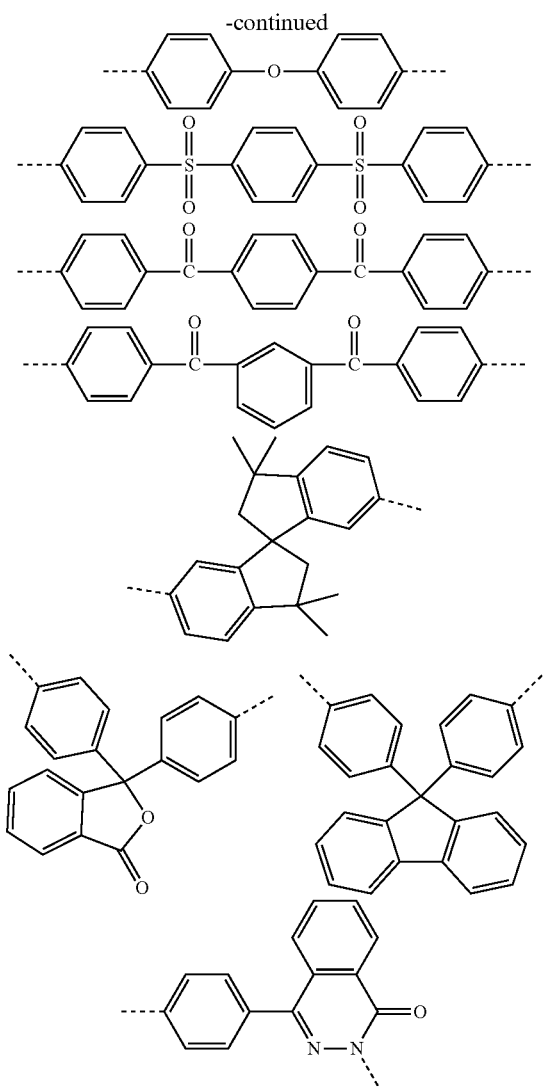

Suitably, the number of moles of monomers which include chlorine and fluorine atoms which are polycondensed in the method are in slight molar excess over the number of moles of monomers that include NH and OH end groups.

The difluoro aromatic ketone compound is selected from 4,4'-difluorobenzophenone, 1,4-bis(4-fluorobenzoyl)benzene, 1,3-bis(4-fluorobenzoyl)benzene, mixtures of 4,4'-difluorobenzophone and 1,4-bis(4-fluorobenzoyl)benzene, mixtures of 4,4'-difluorobenzophenone and 1,3-bis(4-fluorobenzoyl)benzene, mixtures of 4,4'-difluorobenzophenone, 1,4-bis(4-fluorobenzoyl)benzene and 1,3-bis(4-fluorobenzoyl)benzene, and mixtures of 1,4-bis(4-fluorobenzoyl)benzene and 1,3-bis(4-fluorobenzoyl)benzene.

2-Benzimidazolinone, 4,4'-biphenol, Bisphenol-A, and bis(4-hydroxylphenyl)sulfone are selected as the bisphenol or bisphenol equivalent compounds.

The process according to the present invention may also further comprise the end-capping of the obtained copolymer. The copolymer may be end-capped by the addition of excess of a dihalo compound, preferably a dihalo compound such as 4,4'-difluorobenzophenone or bis(4-chlorophenyl)sulfone. However it can also be end capped using a monofunctional alkyl chloride such as methyl chloride.

In the method according to the present invention, the molar ratio (V:VIII) of compound V and compound VIII preferably ranges from 95:5 to 5:95, more preferably ranges from 70:30 to 15:85, and further preferably ranges from 40:60 to 60:40.

In the method according to the present invention, the molar ratio (VII:V) of compound VII and compound V preferably ranges from 1:99 to 50:50, more preferably ranges from 5:95 to 40:60, and further preferably ranges from 10:90 to 30:70.

In the method according to the present invention, the molar ratio (VI:VII) of compound VI and compound VII preferably ranges from 99.95:0.05 to 60:40, more preferably ranges from 99.5:0.5 to 70:30, and further preferably ranges from 99.0:1.0 to 90:10.

In the method according to the present invention, the molar ratio ((VII+VI):(V+VIII)) of the dihalo compounds (VII+VI) and the dihydroxy and dihydroxy equivalent compounds (V+VI) preferably ranges from 105:100 to 95:100, more preferably ranges from 103:100 to 97:100, further preferably ranges from 102:100 to 99:100.

In the method according to the present invention, the molar ratio (V:VIII) of compound V and compound VIII is suitably in the range of 10:90 to 55:45, the molar ratio (VII:V) of compound VII and compound V is suitably in the range of 5:95 to 30:70, the molar ratio of (VI:VII) of compound VI and compound VII is suitably in the range of 99.5:0.5 to 60:40, and the molar ratio ((VII+VI):(V+VIII)) of the dihalo compounds (VII+VI) and the dihydroxy and dihydroxy equivalent compounds (V+VI) is suitably in the range of 104:100 to 99:100.

The addition of a small amount of difluoro aromatic ketone compound VII unexpected results in a polysulfone copolymer having improved heat resistance, higher thermal stability, and improved flame resistance.

The polysulfone copolymer of the present invention may be prepared in solution by heating the monomers dissolved in a polar aprotic solvent such as dimethylacetamide (DMAc), or dimethylsulfoxide (DMSO), or N-Methyl-2-pyrrolidone (NMP), or N-cyclohexyl-2-pyrrolidone (CHP), or sulfolane or diphenylsulfone, or mixtures thereof at elevated temperature in present of anhydrous alkali metal carbonate or a mixture of alkali metal carbonates. The alkali metal carbonates are typically sodium carbonate, potassium carbonate or a mixture of sodium carbonate and potassium carbonate. The alkali metal carbonates can be anhydrous. Water formed during initial reaction can be removed, e.g., by dehydration via azeotropic distillation with organic solvent such as toluene or xylene or chlorobenzene, prior to reaching the polymerization temperature.

The total amount of alkali metal carbonate used can be such that there is at least 1 equivalent of alkali metal for each NH and OH groups. An excess of alkali metal carbonate can be employed, and there may be 1.0 to 1.2 equivalent of alkali metal per NH and OH groups.

In various embodiments of the present invention, the polymerization is carried out in hydrophilic organic solvent such as dimethylacetamide (DMAc), or dimethyl sulfoxide (DMSO), or N-Methyl-2-pyrrolidone (NMP), or N-cyclohexyl-2-pyrrolidone (CHP) or sulfolane, or mixtures thereof at temperature below 300° C. under ambient pressure or pressurized environment. In certain embodiments, the polymerization is carried out at temperatures from about 130° C. to about 250° C. In some embodiments, the polymerization temperature is from about 150° C. to about 230° C.

In the first step of reaction, the monomers (V) and (VI) are heated, in the method of the invention, at a first temperature of at least 130° C., preferably at least 140° C., more preferably at least 150° C. in presence of K$_2$CO$_3$ and azeotropic solvent to form NK group. The reaction is generally pursued by heating the resulting mixture at a temperature of at about 160° C. to about 180° C. to dehydrate the reaction mixture with removal of water via azeotropic distillation. The dehydrated reaction mixture is then heated to a temperature of at least 180° C., preferably at least 210° C., and more preferably at least 230° C., at a temperature ramp rate of less than 20° C./minute, preferably less than 10° C./minute and/or at a temperature ramp rate of less than 5° C./minute. Once the final target temperature is attained, the reaction is generally continued for a limited time at this temperature to form oligomers.

In the second step of reaction, monomer (VII) or a mixture of monomers (VII) is added to the reaction mixture, and the reaction is continued for another limited time, and then cooled to temperatures below 180° C., preferably below 160° C.

In the third step of reaction, monomer (VIII) or a mixture of monomers (VIII) is added along with required additional amount of K$_2$CO$_3$, additional amount of hydrophilic organic solvent and azeotropic solvent. The reaction mixture is heated at about 130° C. to about 160° C. to form bisphenol potassium salts. The reaction is generally pursued by heating the resulting mixture at a temperature of at about 160° C. to about 180° C. to dehydrate the reaction mixture with removal of water via azeotropic distillation. The dehydrated reaction mixture is then heated to a temperature of at least 180° C., preferably at least 210° C., and more preferably at least 230° C., at a temperature ramp rate of less than 20° C./minute, preferably less than 10° C./minute and/or at a temperature ramp rate of less than 5° C./minute. Once the final target temperature is attained, the reaction is generally continued for a limited time at this temperature to form high molecular weight polymer.

It is also preferable that the monomer (V) is heated, in the process of the invention, at a first temperature of at least 130° C., preferably at least 140° C., more preferably at least 150° C. in presence of K$_2$CO$_3$ and azeotropic solvent to form NK group. The reaction is generally pursued by heating the resulting mixture at a temperature of at about 160° C. to about 180° C. to dehydrate the reaction mixture with removal of water via azeotropic distillation. Monomer (VI) is then added to the dehydrated reaction mixture, and the reaction mixture is then heated to a temperature of at least 190° C., preferably at least 210° C., and more preferably at least 230° C., at a temperature ramp rate of less than 20° C./minute, preferably less than 10° C./minute and/or at a temperature ramp rate of less than 5° C./minute. Once the target temperature is attained, the reaction is generally continued for a limited time at this temperature, followed by addition of monomer (VII) or a mixture of monomers (VII), and the reaction is continued for another limited time. Then pre-formed anhydrous potassium salt of monomer (VIII) or potassium salt of a mixture of monomers (VIII) in the hydrophilic organic solvent is added to the reaction mixture. The reaction is then continued at elevated temperature for a limited time to form high molecular weight polymer.

The invented process is well suited for preparation the above described polysulfone copolymers.

EXAMPLES

The following examples are illustrative of the practice of the present invention and are not intended in any way to limit their scope. The synthesis conditions of each example and the results of each example are summarized in Table 2, Table 3, and Table 4.

Polyphenylsulfone Copolymers from 2H-benzimidazol-2-one and 4,4'-biphenol with 4,4'-bis(4-chlorophenyl)sulfone and 4,4'-difluorobenzophenone or 1,4-bis(4-fluorobenzoyl)benzene as Comonomers Comparable Example A: Preparation of Polyphenylsulfone Copolymer cPPSU-A In a 250 ml 3-neck reaction vessel equipped with a mechanical stirrer, an argon inlet tube, a thermocouple plunging in the reaction medium, and a Dean-Stark trap with a condenser, were introduced 35.0 g of N-cyclohexyl-2-pyrrolidone (CHP), 4.38 g (32.68 mmol) of 2H-benzimidazol-2-one, 31.60 g (110.04 mmol) of bis(4-chlorophenyl)sulfone, 4.97 g (35.95 mmol) of anhydrous potassium carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was then heated to 215° C. over 20 minutes. The reaction mixture was kept at 215° C. for 2 hours. The reaction mixture was then cooled to 155° C. over 30 minutes. Under argon protection, 14.20 g (76.26 mmol) of 4,4'-biphenol, 11.59 g (83.89 mmol) of anhydrous potassium carbonate, 40.0 g of CHP and 20 ml of xylene were added. The reaction mixture was kept at 155° C. for 30 minutes, and it was then heated to 175° C. and kept at 175° C. for 90 minutes. During this process xylene along with water were distilled, collected in Dean-Stark trap and removed. At end of 90 minutes reaction, the reaction mixture was heated to 195° C. over 10 minutes and the polymerization was kept at 195° C. for 9 hours. After 9 hours reaction at 195° C., the viscous reaction mixture was cooled under stirring to less than 150° C. The viscous solution was then poured slowly into a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 41.4 g of powder. The structure of the obtained copolymer cPPSU-A can be sketched, in terms of repeating units, as follows:

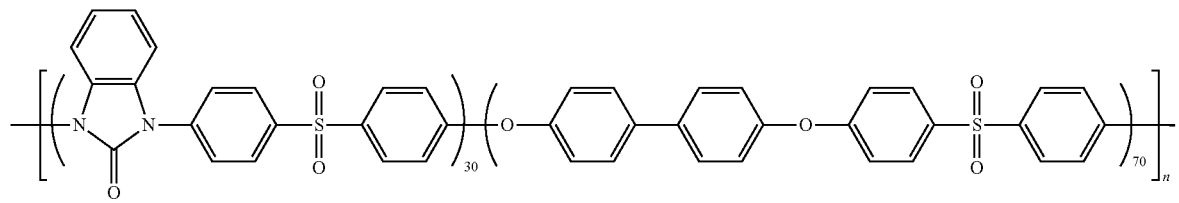

Figure 2:
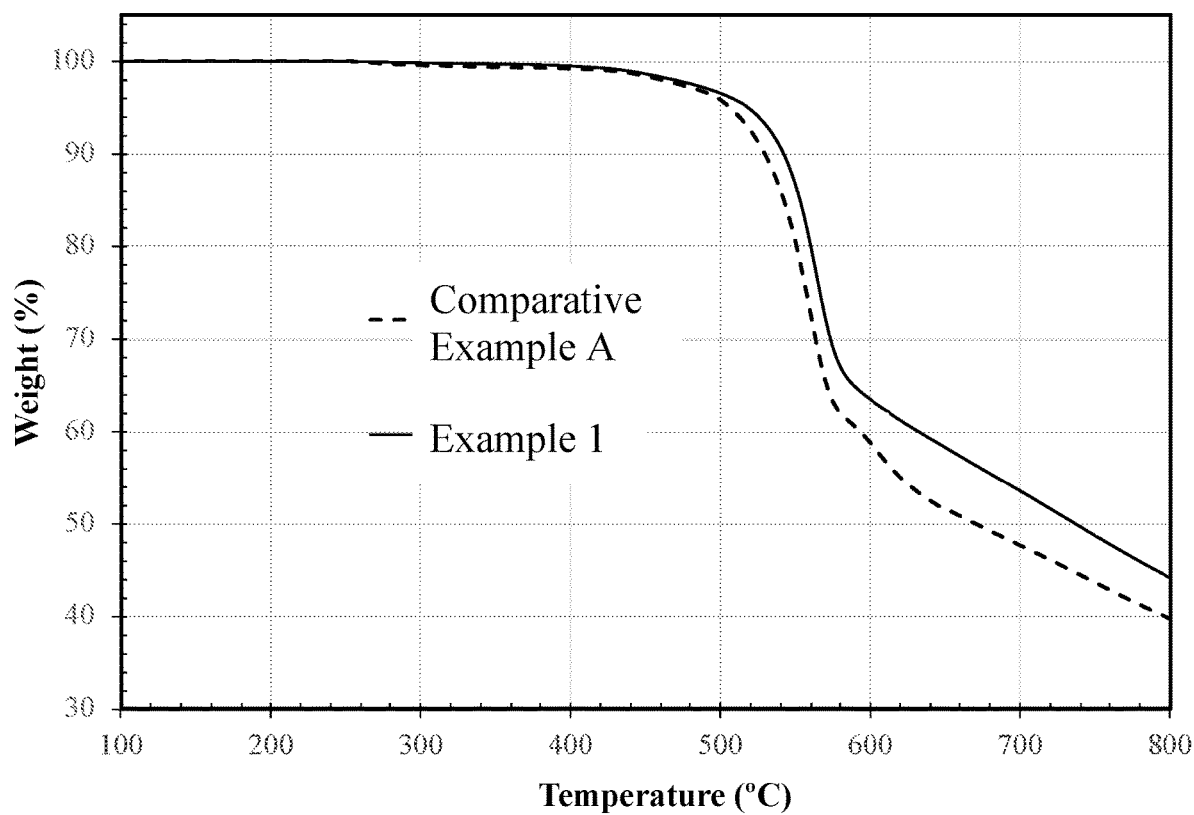
FIG. 2 is a graphical plot of TGA heating curve at 20° C./minute in nitrogen for the polysulfone copolymer of Example 1 and the polysulfone copolymer of Comparative Example A.

The inherent viscosity (IV) of the copolymer, measured at 0.5 wt/vol % in NMP at 30° C., as above detailed, was found to be 0.33 dL/g. DSC analysis (FIG. 1) from second heating scan from 50° C. to 380° C. showed a $T_g$ of 240° C. The sample was inspected after DSC analysis. The sample was fully fused together after DSC analysis and was brittle by hammering. TGA analysis (FIG. 2) in nitrogen atmosphere from 50° C. to 800° C. showed a 5% weight loss temperature (TGA-5%) of 506° C. and residual or char content of 39.7% at 800° C. The results are summarized in Table 2 and Table 3.

Example 1: Preparation of Polyphenylsulfone Copolymer—cPPSU-1

In a 250 ml 3-neck reaction vessel equipped with a mechanical stirrer, an argon inlet tube, a thermocouple plunging in the reaction medium, and a Dean-Stark trap with a condenser, were introduced 35.0 g of N-cyclohexyl-2-pyrrolidone (CHP), 4.38 g (32.68 mmol) of 2H-benzimidazol-2-one, 30.89 g (107.58 mmol) of bis(4-chlorophenyl)sulfone, 4.97 g (35.95 mmol) of anhydrous potassium carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was heated to 215° C. over 20 minutes. The reaction mixture was kept at 215° C. for 2 hours, then 0.53 g (2.44 mmol) of 4,4'-difluorobenzophenone was added. The reaction mixture was kept at 215° C. for 1 hour, it was then cooled to 155° C. Under argon protection, 14.20 g (76.26 mmol) of 4,4'-biphenol, 11.59 g (83.89 mmol) of anhydrous potassium carbonate, 40.0 g of CHP and 20 ml of xylene were added. The reaction mixture was kept at 155° C. for 30 minutes, and it was then heated to 175° C. and kept at 175° C. for 90 minutes. During this process xylene along with water were distilled, collected in Dean-Stark trap and removed. At end of 90 minutes reaction, the reaction mixture was heated to 195° C. over 10 minutes and the polymerization was kept at 195° C. for 3 hours. During this process, the reaction mixture became viscous after 1 hour at 195° C., and highly viscous after 2 hours at 195° C. After 3 hours reaction at 195° C., the highly viscous reaction mixture was cooled under stirring to less than 150° C. The highly viscous solution was then poured slowly into a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 41.2 g of powder. The structure of the obtained copolymer cPPSU-1 can be sketched, in terms of repeating units, as follows:

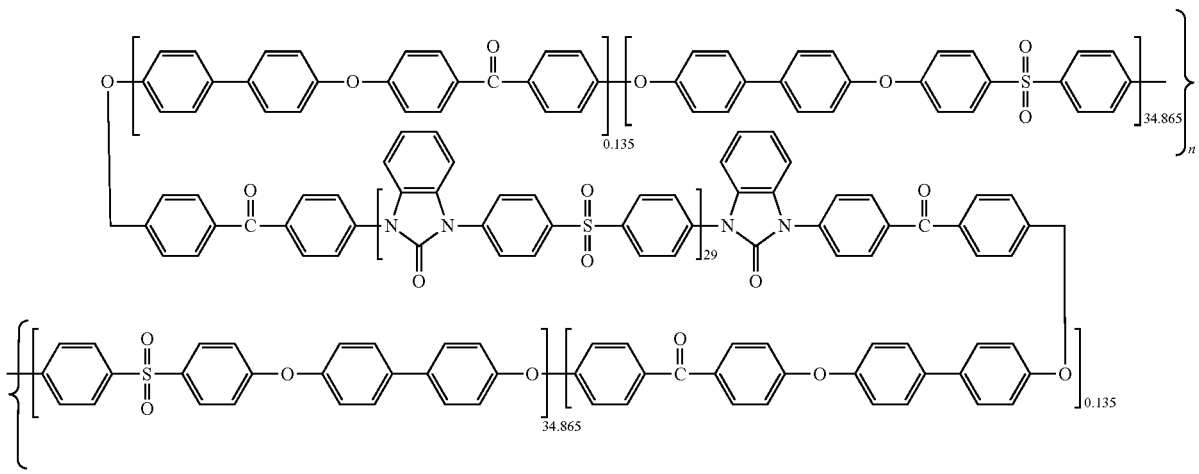

The inherent viscosity (IV) of the copolymer, measured at 0.5 wt/vol % in NMP at 30° C., as above detailed, was found to be 0.60 dL/g. DSC analysis (FIG. 1) from second heating scan from 50° C. to 380° C. showed $T_g$ of 252° C. The sample was inspected after DSC analysis. The sample was fully fused together after DSC analysis and was very tough by hammering. The $T_g$ of this copolymer is unexpectedly 12° C. higher than that of the copolymer from Comparative Example A. TGA analysis (FIG. 2) in nitrogen atmosphere from 50° C. to 800° C. showed a 5% weight loss temperature (TGA-5%) of 518° C. and residual of 44.2% at 800° C. The TGA-5% of this copolymer is 12° C. higher than that of the copolymer from Comparative Example A, and the residual or char content at 800° C. for this copolymer is 11.3% higher than that of the copolymer from Comparative Example A, indicating this copolymer has surprisingly higher thermal stability and improved flame resistance than the copolymer from Comparative Example A. The results are summarized in Table 2 and Table 3.

Example 2: Preparation of Polyphenylsulfone Copolymer—cPPSU-2

In a 250 ml 3-neck reaction vessel equipped with a mechanical stirrer, an argon inlet tube, a thermocouple plunging in the reaction medium, and a Dean-Stark trap with a condenser, were introduced 35.0 g of N-cyclohexyl-2-pyrrolidone (CHP), 4.38 g (32.68 mmol) of 2H-benzimidazol-2-one, 30.97 g (107.84 mmol) of bis(4-chlorophenyl) sulfone, 4.97 g (35.95 mmol) of anhydrous potassium carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was heated to 215° C. over 20 minutes. The reaction mixture was kept at 215° C. for 2 hours, then 0.48 g (2.19 mmol) of 4,4'-difluorobenzophenone was added. The reaction mixture was kept at 215° C. for 1 hour, it was then cooled to 155° C. Under argon protection, 14.20 g (76.26 mmol) of 4,4'-biphenol, 11.59 g (83.89 mmol) of anhydrous potassium carbonate, 40.0 g of CHP and 20 ml of xylene were added. The reaction mixture was kept at 155° C. for 30 minutes, it was then heated to 175° C. and kept at 175° C. for 90 minutes. During this process xylene along with water were distilled, collected in Dean-Stark trap and removed. At end of 90 minutes reaction, the reaction mixture was heated to 195° C. over 10 minutes and the polymerization was kept at 195° C. for 2.5 hours. During this process, the reaction mixture became viscous after 1 hour at 195° C., and highly viscous after 2 hours at 195° C. After 2.5 hours reaction at 195° C., the highly viscous reaction mixture was cooled under stirring to less than 150° C. The highly viscous solution was then poured slowly into a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 41.5 g of powder. The structure of the obtained copolymer cPPSU-2 can be sketched, in terms of repeating units, as follows:

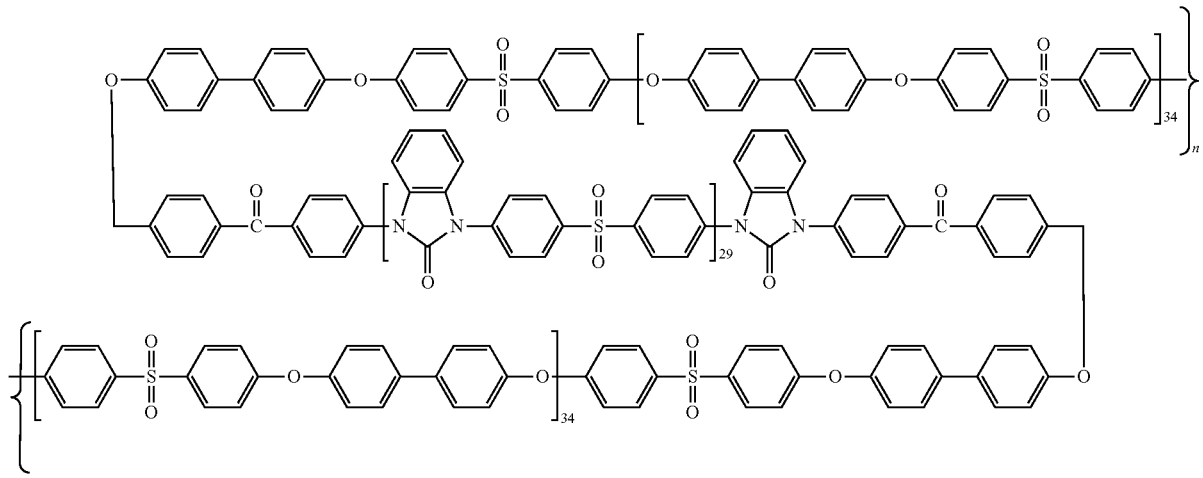

The inherent viscosity (IV) of the copolymer, measured at 0.5 wt/vol % in NMP at 30° C., as above detailed, was found to be 0.55 dL/g. DSC analysis from second heating scan from 50° C. to 380° C. showed a Tg of 253° C. The sample was inspected after DSC analysis. The sample was fully fused together after DSC analysis and was very tough by hammering. The results are summarized in Table 2 and Table 3.

Example 3: Preparation of Polyphenylsulfone Copolymer—cPPSU-3

In a 250 ml 3-neck reaction vessel equipped with a mechanical stirrer, an argon inlet tube, a thermocouple plunging in the reaction medium, and a Dean-Stark trap with a condenser, were introduced 35.0 g of N-cyclohexyl-2-pyrrolidone (CHP), 4.38 g (32.68 mmol) of 2H-benzimidazol-2-one, 30.19 g (105.13 mmol) of bis(4-chlorophenyl) sulfone, 4.97 g (35.95 mmol) of anhydrous potassium carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was heated to 215° C. over 20 minutes. The reaction mixture was kept at 215° C. for 2 hours, then 1.07 g (4.90 mmol) of 4,4'-difluorobenzophenone was added. The reaction mixture was kept at 215° C. for 1 hour, it was then cooled to 155° C. Under argon protection, 14.20 g (76.26 mmol) of 4,4'-biphenol, 11.59 g (83.89 mmol) of anhydrous potassium carbonate, 40.0 g of CHP and 20 ml of xylene were added. The reaction mixture was kept at 155° C. for 30 minutes, it was then heated to 175° C. and kept at 175° C. for 90 minutes. During this process xylene along with water were distilled, collected in Dean-Stark trap and removed. At end of 90 minutes reaction, the reaction mixture was heated to 195° C. over 10 minutes and the polymerization was kept at 195° C. for 3.5 hours. During this process, the reaction mixture became viscous after 1 hour at 195° C., and highly viscous after 2 hours at 195° C. After 3.5 hours reaction at 195° C., the highly viscous reaction mixture was cooled under stirring to less than 150° C. The highly viscous solution was then poured slowly into a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 41.3 g of powder. The structure of the obtained copolymer cPPSU-3 can be sketched, in terms of repeating units, as follows:

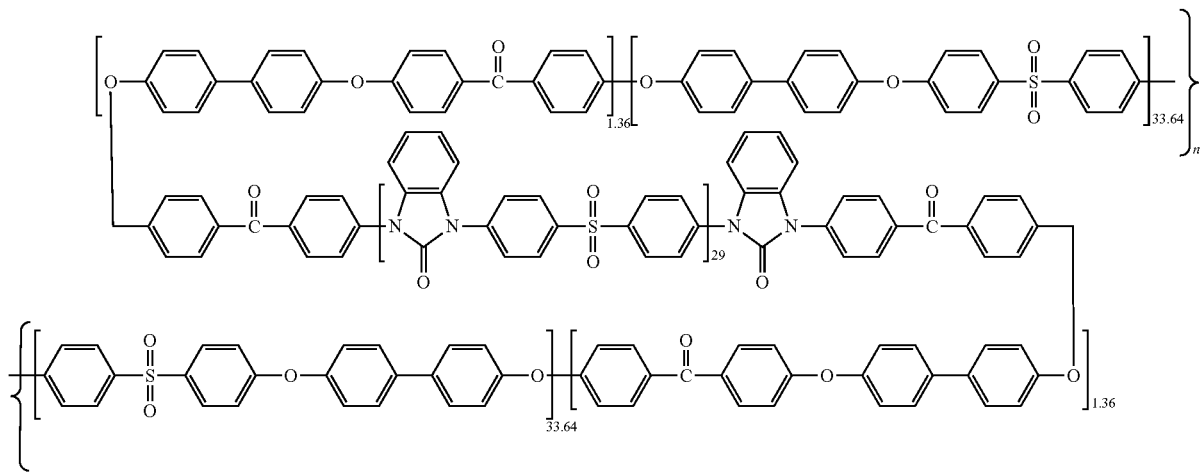

The inherent viscosity (IV) of the copolymer, measured at 0.5 wt/vol % in NMP at 30° C., as above detailed, was found to be 0.65 dL/g. DSC analysis from second heating scan from 50° C. to 380° C. showed a $T_g$ of 247° C. The sample was inspected after DSC analysis. The sample was fully fused together after DSC analysis and was very tough by hammering. The results are summarized in Table 2 and Table 3.

Example 4: Preparation of Polyphenylsulfone Copolymer—cPPSU-4

In a 250 ml 3-neck reaction vessel equipped with a mechanical stirrer, an argon inlet tube, a thermocouple plunging in the reaction medium, and a Dean-Stark trap with a condenser, were introduced 37.0 g of N-cyclohexyl-2-pyrrolidone (CHP), 6.18 g (46.03 mmol) of 2H-benzimidazol-2-one, 31.51 g (109.74 mmol) of bis(4-chlorophenyl)sulfone, 8.40 g (60.76 mmol) of anhydrous potassium carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was heated to 215° C. over 20 minutes. The reaction mixture was kept at 215° C. for 4 hours, then 0.40 g (1.84 mmol) of 4,4'-difluorobenzophenone was added. The reaction mixture was kept at 215° C. for 1 hour, it was then cooled to 155° C. Under argon protection, 12.00 g (64.44 mmol) of 4,4'-biphenol, 8.40 g (60.76 mmol) of anhydrous potassium carbonate, 38.0 g of CHP and 20 ml of xylene were added. The reaction mixture was kept at 155° C. for 30 minutes, and it was then heated to 175° C. and kept at 175° C. for 90 minutes. During this process xylene along with water were distilled, collected in Dean-Stark trap and removed. At end of 90 minutes reaction, the reaction mixture was heated to 195° C. over 10 minutes and the polymerization was kept at 195° C. for 5 hours. During this process, the reaction mixture became viscous after 2 hour at 195° C., and highly viscous after 5 hours at 195° C. After 5 hours reaction at 195° C., the highly viscous reaction mixture was cooled under stirring to less than 150° C. The highly viscous solution was then poured slowly into a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 40.5 g of powder. The structure of the obtained copolymer cPPSU-4 can be sketched, in terms of repeating units, as follows:

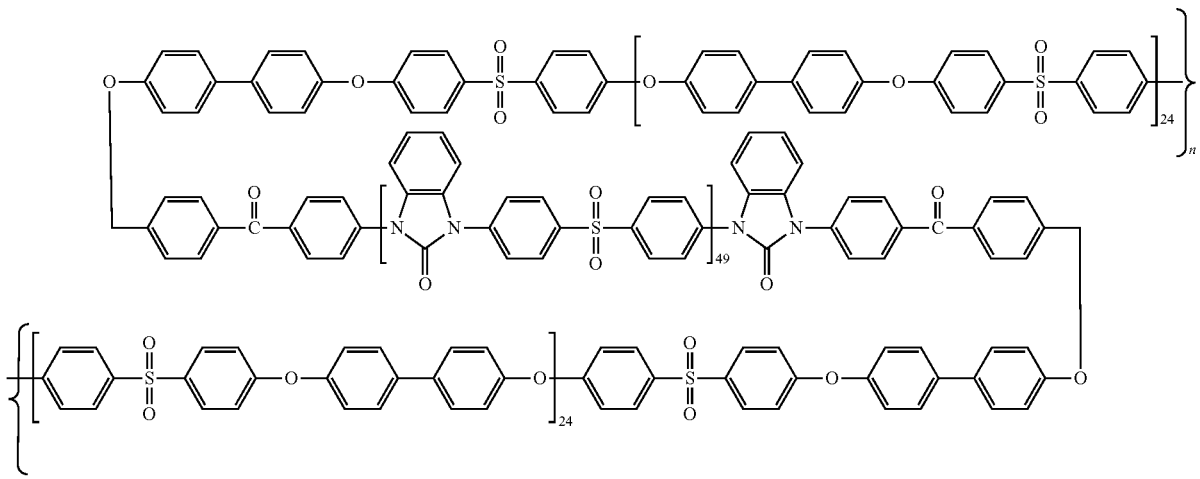

The inherent viscosity (IV) of the copolymer, measured at 0.5 wt/vol % in NMP at 30° C., as above detailed, was found to be 0.45 dL/g. DSC analysis from second heating scan from 50° C. to 380° C. showed a $T_g$ of 271° C. The sample was inspected after DSC analysis. The sample was fully fused together after DSC analysis and was tough by hammering. The results are summarized in Table 2 and Table 3.

Example 5: Preparation of Polyphenylsulfone Copolymer—cPPSU-5

In a 250 ml 3-neck reaction vessel equipped with a mechanical stirrer, an argon inlet tube, a thermocouple plunging in the reaction medium, and a Dean-Stark trap with a condenser, were introduced 35.0 g of N-cyclohexyl-2-pyrrolidone (CHP), 4.38 g (32.68 mmol) of 2H-benzimidazol-2-one, 30.19 g (105.13 mmol) of bis(4-chlorophenyl)sulfone, 4.97 g (35.95 mmol) of anhydrous potassium carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was heated to 215° C. over 20 minutes. The reaction mixture was kept at 215° C. for 2 hours, then 1.58 g (4.90 mmol) of 1,4-bis(4-fluorobenzoyl)benzene was added. The reaction mixture was kept at 195° C. for 1 hour, it was then cooled to 155° C. Under argon protection, 14.20 g (76.26 mmol) of 4,4'-biphenol, 11.59 g (83.89 mmol) of anhydrous potassium carbonate, 40.0 g of CHP and 20 ml of xylene were added. The reaction mixture was kept at 155° C. for 30 minutes, and it was then heated to 175° C. and kept at 175° C. for 90 minutes. During this process xylene along with water were distilled, collected in Dean-Stark trap and removed. At end of 90 minutes reaction, the reaction mixture was heated to 195° C. over 10 minutes and the polymerization was kept at 195° C. for 4 hours. During this process, the reaction mixture became viscous after 1 hour at 195° C., and highly viscous after 2 hours at 195° C. After 4 hours reaction at 195° C., the highly viscous reaction mixture was cooled to less than 150° C. under stirring. The highly viscous solution was then poured slowly into a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 41.3 g of powder. The structure of the obtained copolymer PPSUC-5 can be sketched, in terms of repeating units, as follows:

The inherent viscosity (IV) of the copolymer, measured at 0.5 wt/vol % in NMP at 30° C., as above detailed, was found to be 0.70 dL/g. DSC analysis from second heating scan from 50° C. to 380° C. showed a $T_g$ of 241° C. The sample was inspected after DSC analysis. The sample was fully fused together after DSC analysis and was very tough by hammering. The results are summarized in Table 2 and Table 3.

TABLE 2

Summary of the synthesis conditions for Comparative Example A and Examples from Example 1 to Example 5

| Example | Molar ratio of BI:BP | Molar ratio of DFB:BI | Molar ratio of DFBB:BI | Molar ratio of BCPS:[DFB + DFBB] |
|---|---|---|---|---|
| Comparative Example A | 30:70 | 0:100 | 0:100 | 100:0 |
| Example 1 | 30:70 | 7.5:100.0 | 0:100 | 97.78:2.22 |
| Example 2 | 30:70 | 6.7:100.0 | 0:100 | 98.01:1.99 |
| Example 3 | 30:70 | 15.0:100.0 | 0:100 | 95.55:4.45 |
| Example 4 | 50:50 | 5.6:100.0 | 0:100 | 98.35:1.65 |
| Example 5 | 30/70 | 0:100 | 15.0:100.0 | 95.55:4.45 |

In Table 2, the following abbreviations are used: BI refers to 2H-benzimidazol-2-one; BP refers to 4,4'-biphenol; BCPS refers to bis(4-chlorophenyl)sulfone; DFB refers to 4.4'-difluorobenzophenone; and DFBB refers to 1,4-bis(4-fluorobenzoyl)benzene.

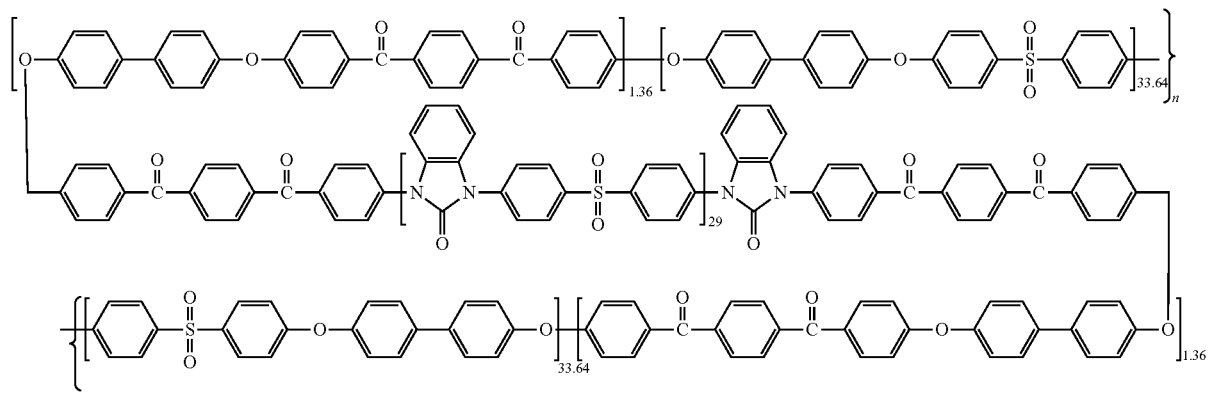

TABLE 3

| | Summary of polymer properties of Comparative Example A and Examples of Example 1 to Example 5 | | | | | | |
|---|---|---|---|---|---|---|---|
| Example | Molar ratio of BI:BP | Molar ratio of DFB:BI | Molar ratio of DFBB:BI | Glass transition temperature $T_g$ (° C.) | Inherent viscosity IV (dL/g) | TGA-5% (° C.) | Residue at 800° C. (%) |
| Comparative Example A | 30:70 | 0:100 | 0:100 | 240 | 0.33 | 506 | 39.7 |
| Example 1 | 30:70 | 7.5:100.0 | 0:100 | 252 | 0.60 | 518 | 44.2 |
| Example 2 | 30:70 | 6.7:100.0 | 0:100 | 253 | 0.55 | | |
| Example 3 | 30:70 | 15.0:100.0 | 0:100 | 247 | 0.65 | | |
| Example 4 | 50:50 | 6.7:100.0 | 0:100 | 271 | 0.45 | | |
| Example 5 | 30:70 | 0:100 | 15.0:100.0 | 241 | 0.70 | | |

In Table 3, the following abbreviations are used: BI refers to 2H-benzimidazol-2-one; BP refers to 4,4'-biphenyl; DFB refers to 4.4'-difluorobenzophenone; and DFBB refers to 1,4-bis(4-fluorobenzoyl)benzene.

Polysulfone copolymers from 2H-benzimidazol-2-one and Bisphenol-A with 4,4'-bis(4-chlorophenyl)sulfone and difluorobenzophenone as Comonomers Comparable Example B: Preparation of Polysulfone Copolymer cPSU-B In a 250 ml 3-neck reaction vessel equipped with a mechanical stirrer, an argon inlet tube, a thermocouple plunging in the reaction medium, and a Dean-Stark trap with a condenser, were introduced 35.0 g of N-cyclohexyl-2-pyrrolidone (CHP), 1.98 g (14.79 mmol) of 2H-benzimidazol-2-one, 28.60 g (99.59 mmol) of bis(4-chlorophenyl)sulfone, 2.25 g (16.27 mmol) of anhydrous potassium carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was heated to 215° C. over 20 minutes. The reaction mixture was then cooled to 155° C. over 30 minutes. Under argon protection, 19.13 g (83.81 mmol) of Bisphenol-A, 12.77 g (92.20 mmol) of anhydrous potassium carbonate, 40.0 g of CHP and 20 ml of xylene were added. The reaction mixture was kept at 155° C. for 30 minutes, and it was then heated to 175° C. and kept at 175° C. for 90 minutes. During this process xylene along with water were distilled, collected in Dean-Stark trap and removed. At end of 90 minutes reaction, the reaction mixture was heated to 195° C. over 10 minutes and the polymerization was kept at 195° C. for 10 hours. After 10 hours reaction at 195° C., the reaction mixture in medium viscosity was cooled under stirring to less than 150° C. The medium viscous solution was then poured slowly into a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 120° C. under vacuum for 12 hours yielding 42.0 g of powder. The structure of the obtained copolymer cPSU-B can be sketched, in terms of repeating units, as follows:

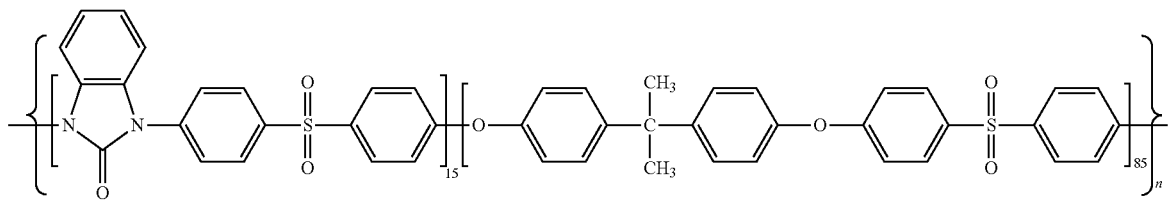

Figure 3:
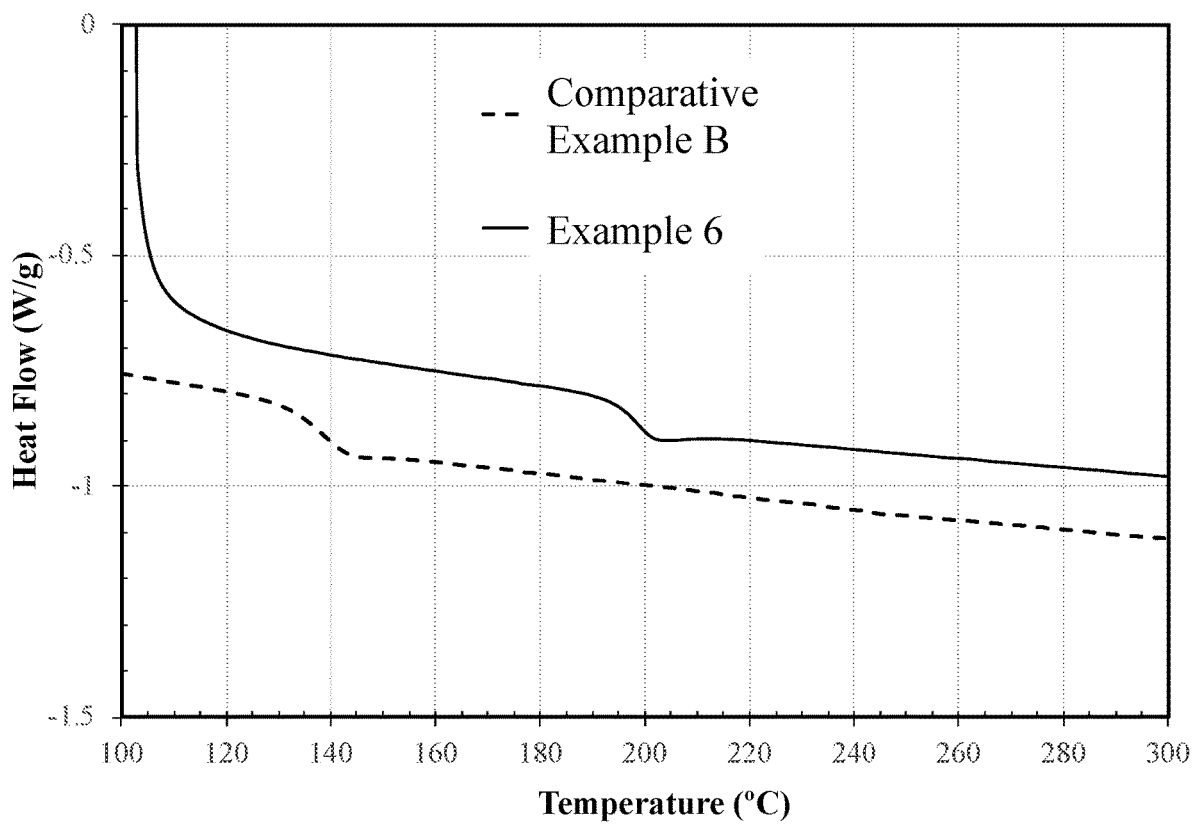
FIG. 3 is a graphical plot of DSC heating scan curve at 20° C./minute for the polysulfone copolymer of Example 6 and the polysulfone copolymer of Comparative Example B.

The inherent viscosity (IV) of the copolymer, measured at 0.5 wt/vol % in NMP at 30° C., as above detailed, was found to be 0.12 dL/g. DSC analysis (FIG. 3) from second heating scan from 50° C. to 300° C. showed a $T_g$ of 140° C. The sample was inspected after DSC analysis. The sample was fully fused together after DSC analysis, but it was extremely brittle. This indicates that the resulting polymer was low molecular weight oligomers.

Comparable Example C: Preparation of Polysulfone Copolymer cPSU-C

In a 250 ml 3-neck reaction vessel equipped with a mechanical stirrer, an argon inlet tube, a thermocouple plunging in the reaction medium, and a Dean-Stark trap with a condenser, were introduced 35.0 g of N-cyclohexyl-2-pyrrolidone (CHP), 4.10 g (30.59 mmol) of 2H-benzimidazol-2-one, 29.50 g (102.73 mmol) of bis(4-chlorophenyl)sulfone, 4.65 g (33.65 mmol) of anhydrous potassium carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was heated to 215° C. over 20 minutes. The reaction mixture was kept at 215° C. for 2 hours. The reaction mixture was then cooled to 155° C. over 30 minutes. Under argon protection, 16.29 g (71.37 mmol) of Bisphenol-A, 10.85 g (78.51 mmol) of anhydrous potassium carbonate, 40.0 g of CHP and 20 ml of xylene were added. The reaction mixture was kept at 155° C. for 30 minutes, and it was then heated to 175° C. and kept at 175° C. for 90 minutes. During this process xylene along with water were distilled, collected in Dean-Stark trap and removed. At end of 90 minutes reaction, the reaction mixture was heated to 195° C. over 10 minutes and the polymerization was kept at 195° C. for 16 hours. After 16 hours reaction at 195° C., the reaction mixture in medium viscosity was cooled to less than 150° C. under stirring. The medium viscous solution was then poured slowly into a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 120° C. under vacuum for 12 hours yielding 39.6 g of powder. The structure of the obtained copolymer cPSU-C can be sketched, in terms of repeating units, as follows:

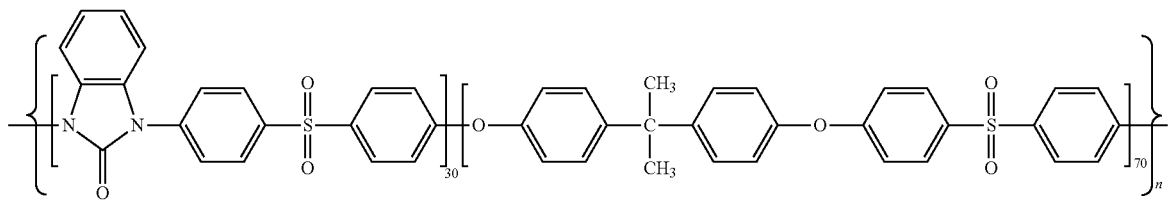

The inherent viscosity (IV) of the copolymer, measured at 0.5 wt/vol % in NMP at 30° C., as above detailed, was found to be 0.10 dL/g. DSC analysis from second heating scan from 50° C. to 300° C. showed a $T_g$ of 142° C. The sample was inspected after DSC analysis. The sample was fully fused together after DSC analysis, but it was extremely brittle. This indicates that the resulting polymer was low molecular weight oligomers.

Example 6: Preparation of Polysulfone Copolymer—cPSU-1

In a 250 ml 3-neck reaction vessel equipped with a mechanical stirrer, an argon inlet tube, a thermocouple plunging in the reaction medium, and a Dean-Stark trap with a condenser, were introduced 20.0 g of N-cyclohexyl-2-pyrrolidone (CHP), 1.87 g (13.91 mmol) of 2H-benzimidazol-2-one, 26.30 g (91.60 mmol) of bis(4-chlorophenyl)sulfone, 2.12 g (15.31 mmol) of anhydrous potassium carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was heated to 215° C. over 20 minutes. The reaction mixture was kept at 215° C. for 2 hours, then 0.23 g (1.04 mmol) of 4,4'-difluorobenzophenone was added. The reaction mixture was kept at 215° C. for 1 hour, it was then cooled to 155° C. Under argon protection, 18.00 g (78.85 mmol) of Bisphenol-A, 11.99 g (86.73 mmol) of anhydrous potassium carbonate, 50.0 g of CHP and 20 ml of xylene were added. The reaction mixture was kept at 155° C. for 30 minutes, it was then heated to 175° C. and kept at 175° C. for 90 minutes. During this process xylene along with water were distilled, collected in Dean-Stark trap and removed. At end of 90 minutes reaction, the reaction mixture was heated to 195° C. over 10 minutes and the polymerization was kept at 195° C. for 5 hours. During this process, the reaction mixture became viscous after 3 hours at 195° C., and highly viscous after 5 hours at 195° C. After 5 hours reaction at 195° C., the highly viscous reaction mixture was cooled under stirring to less than 150° C. The highly viscous solution was then poured slowly into a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 120° C. under vacuum for 12 hours yielding 39.5 g powder. The structure of the obtained copolymer c-PSU-1 can be sketched, in terms of repeating units, as follows:

carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was heated to 215° C. over 20 minutes. The reaction mixture was kept at 215° C. for 2 hours, then 1.01 g (4.62 mmol) of 4,4'-difluorobenzophenone was added. The reaction mixture was kept at 195° C. for 1 hour, it was then cooled to 155° C. Under argon protection, 16.40 g (71.84 mmol) of Bisphenol-A, 10.92 g (79.0 mmol) of anhydrous potassium carbonate, 40.0 g of CHP and 20 ml of xylene were added. The reaction mixture was kept at 155° C. for 30 minutes, it was then heated to 175° C. and kept at 175° C. for 90 minutes. During this process xylene along with water were distilled, collected in Dean-Stark trap and removed. At end of 90 minutes reaction, the reaction mixture was heated to 195° C. over 10 minutes and the polymerization was kept at 195° C. for 7 hours. During this process, the reaction mixture became viscous after 4 hours at 195° C., and highly viscous after 6 hours at 195° C. After 7 hours reaction at 195° C., the highly viscous reaction mixture was cooled under stirring to less than 150° C. The highly viscous solution was then poured slowly into

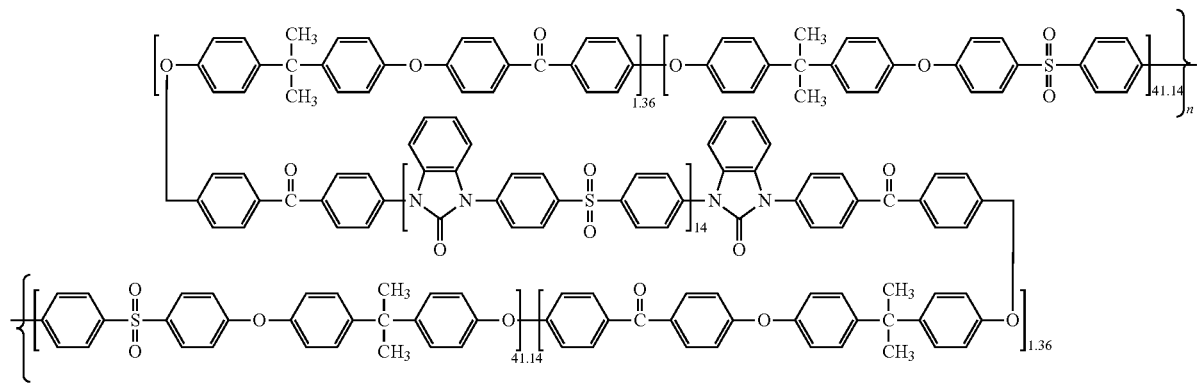

The inherent viscosity (IV) of the copolymer, measured at 0.5 wt/vol % in NMP at 30° C., as above detailed, was found to be 0.55 dL/g. DSC analysis (FIG. 3) from second heating scan from 50° C. to 380° C. showed a $T_g$ of 203° C. The sample was inspected after DSC analysis. The sample was fully fused together after DSC analysis and was tough by hammering. The results are summarized in Table 4.

Example 7: Preparation of Polysulfone Copolymer—cPSU-2

In a 250 ml 3-neck reaction vessel equipped with a mechanical stirrer, an argon inlet tube, a thermocouple plunging in the reaction medium, and a Dean-Stark trap with a condenser, were introduced 35.0 g of N-cyclohexyl-2-pyrrolidone (CHP), 4.13 g (30.79 mmol) of 2H-benzimidazol-2-one, 28.44 g (99.03 mmol) of bis(4-chlorophenyl) sulfone, 4.68 g (33.87 mmol) of anhydrous potassium a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 120° C. under vacuum for 12 hours yielding 38.9 g of powder. The structure of the obtained copolymer c-PSU-2 can be sketched, in terms of repeating units, as follows:

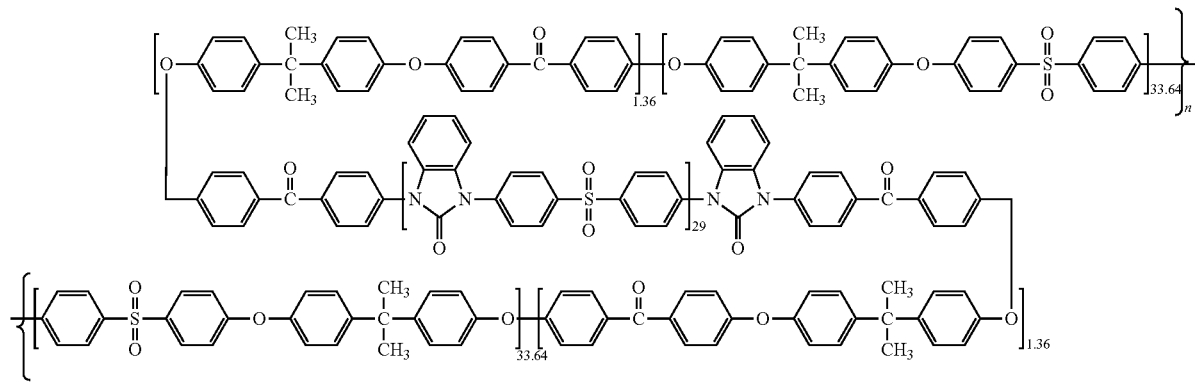

The inherent viscosity (IV) of the copolymer, measured at 0.5 wt/vol % in NMP at 30° C., as above detailed, was found to be 0.45 dL/g. DSC analysis from second heating scan from 50° C. to 380° C. showed a $T_g$ of 217° C. The sample was inspected after DSC analysis. The sample was fully fused together after DSC analysis and was tough by hammering. TGA analysis in nitrogen atmosphere from 50° C. to 800° C. showed a 5% weight loss temperature (TGA-5%) of 490° C. and residual or char content of 36.6% at 800° C., indicating the polymer has high thermal stability and good flame resistance. The results are summarized in Table 4.

Example 8 Preparation of polysluflone Copolymer from 2H-benzimidazol-2-one with bis(4-chlorophenyl)sulfone and 4,4'-difluorobenzophenone—cPSU-3

In a 250 ml 3-neck reaction vessel equipped with a mechanical stirrer, an argon inlet tube, a thermocouple plunging in the reaction medium, and a Dean-Stark trap with a condenser, were introduced 75.0 g of N-cyclohexyl-2-pyrrolidone (CHP), 16.08 g (119.90 mmol) of 2H-benzimidazol-2-one, 31.30 g (109.00 mmol) of bis(4-chlorophenyl)sulfone, 20.07 g (145.21 mmol) of anhydrous potassium carbonate and 20 ml of xylene. The reaction vessel content was evacuated under vacuum and then filled with high purity argon. The reaction mixture was then placed under a constant argon purge (40 ml/min).

The reaction mixture was heated slowly to 155° C. and kept at 155° C. for 30 minutes. The reaction mixture was then heated to 175° C. and kept at 175° C. for 90 minutes. During this process xylene along with water were distilled, collected in Dean-Stark trap and removed. At end of 90 minutes reaction, the reaction mixture was then heated to 215° C. over 20 minutes. The reaction mixture was kept at 215° C. for 5 hours, then 2.64 g (12.11 mmol) of 4,4'-difluorobenzophenone was added. The polymerization was kept at 195° C. for 6 hours. After 6 hours reaction at 195° C., the viscous reaction mixture was cooled under stirring to less than 150° C. The viscous solution was then poured slowly into a Waring blender containing 300 ml de-ionized water. It was mixed for 3 minutes and filtered. The filtered solid was blended with another 100 ml de-ionized water for 3 minutes in a Waring blender and filtered.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 500 ml flask along with 350 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 180° C. under vacuum for 12 hours yielding 44.4 g of powder. The structure of the obtained copolymer cPSU-3 can be sketched, in terms of repeating units, as follows:

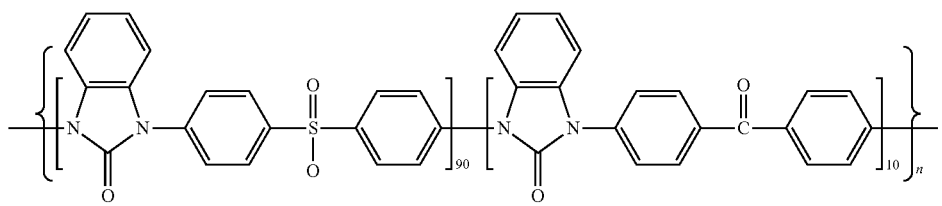

The inherent viscosity (IV) of the copolymer, measured at 0.5 wt/vol % in NMP at 30° C., as above detailed, was found to be 0.57 dL/g. DSC analysis from second heating scan from 50° C. to 400° C. showed a $T_g$ of 300° C. The sample was inspected after DSC analysis. The sample was fused together after DSC analysis and was tough by hammering. The results are summarized in Table 4.

TABLE 4

Summary of the synthesis conditions and properties of Comparative Example B and C, and Examples 6, 7 and 8

| Example | Molar ratio of BI:BPA | Molar ratio of DFB:BI | Molar ratio of BCPS:DFB | Glass transition temperature $T_g$ (° C.) | Inherent viscosity IV (dL/g) | TGA-5% ($T_g$ (° C.)) |
|---|---|---|---|---|---|---|
| Comparative Example B | 15:85 | 0:100 | 100:0 | 140 | 0.12 | |
| Comparative Example B | 30:70 | 0:100 | 100:0 | 142 | 0.10 | |
| Example 6 | 15:85 | 15.0:100.0 | 98.88:1.12 | 203 | 0.55 | |
| Example 7 | 30:70 | 15.0:100.0 | 95.54:4.46 | 217 | 0.45 | 490 |
| Example 8 | 100:0 | 10:100 | 90.00:10.00 | 300 | 0.57 | |

In Table 4, the following abbreviations are used: BI refers to 2H-benzimidazol-2-one; BPA refers to Bisphenol-A; BCPS refers to bis(4-chlorophenyl)sulfone; and DFB refers to 4.4'-difluorobenzophenone.

It will be appreciated that the polysulfone copolymer described in the Examples have high glass transition temperatures from 203° C. to 300° C. They may therefore be advantageously used for production of components and devices that can be used in high temperature and challenging environment in electrical and electronics application, automotive applications, and life science and medical applications.

The invention is not restricted to the details of the foregoing embodiment(s). The invention extends to any novel one, or any novel combination, of the features disclosed in this specification (including any accompanying claims, abstract and drawings), or to any one specific embodiment, or any of several various possible combinations, of the steps of any method or process so disclosed.

The foregoing examples are merely illustrative of the invention, serving to illustrate only some of the features of the present invention. The appended claims are intended to claim the invention as broadly as it has been conceived and the examples herein presented are illustrative of selected embodiments from a manifold of all possible embodiments, suggesting or implying other embodiments of the chemistry described herein. Accordingly, it is Applicant's intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of". Where necessary, ranges have been supplied, those ranges are inclusive of all sub-ranges there between. Such ranges may be viewed as a Markush group or groups consisting of differing pairwise numerical limitations which group or groups is or are fully defined by its lower and upper bounds, increasing in a regular fashion numerically from lower bounds to upper bounds. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims. All United States patents (and patent applications) referenced herein are herewith and hereby specifically incorporated by reference in their entirety as though set forth in full.

Other than in the working examples or where otherwise indicated, all numbers expressing amounts of materials, reaction conditions, time durations, quantified properties of materials, and so forth, stated in the specification are to be understood as being modified in all instances by the term "about."

It will also be understood that any numerical range recited herein is intended to include all sub-ranges within that range.

It will be further understood that any compound, material or substance which is expressly or implicitly disclosed in the specification and/or recited in a claim as belonging to a group of structurally, compositionally and/or functionally related compounds, materials or substances includes individual representatives of the group and all combinations thereof.

The invention claimed is:

1. A polymeric composition comprising a copolymer having the structure

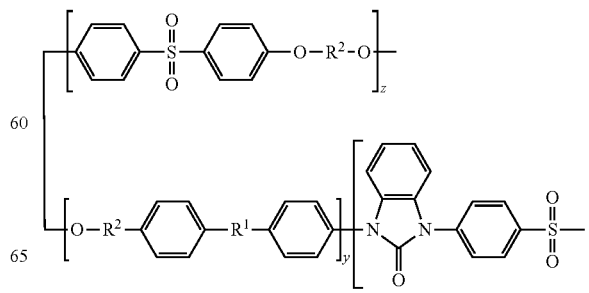

-continued

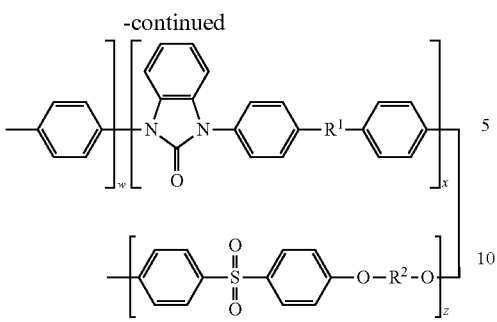

wherein R₁ is a divalent radical selected from the group consisting of:

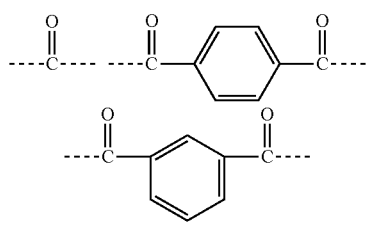

wherein R₂ is a divalent radical selected from the group consisting of:

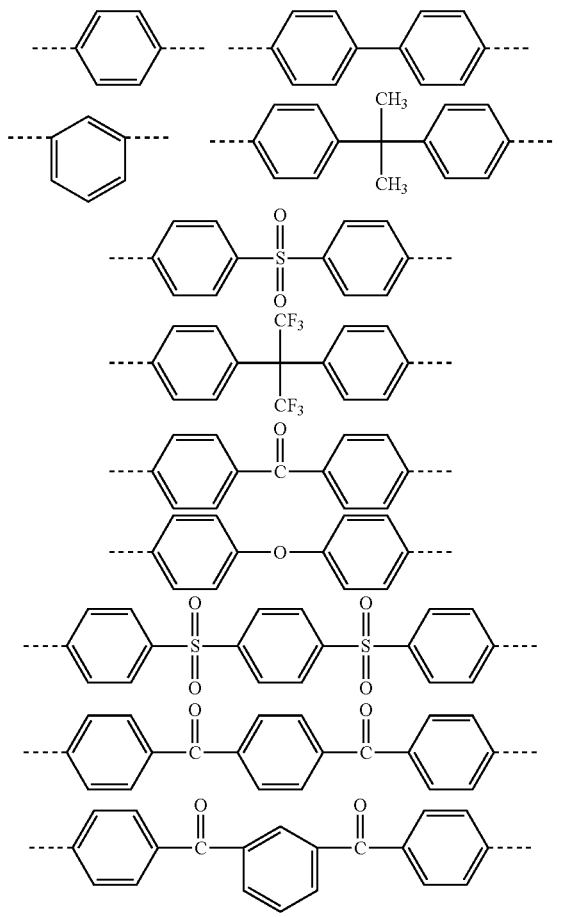

-continued

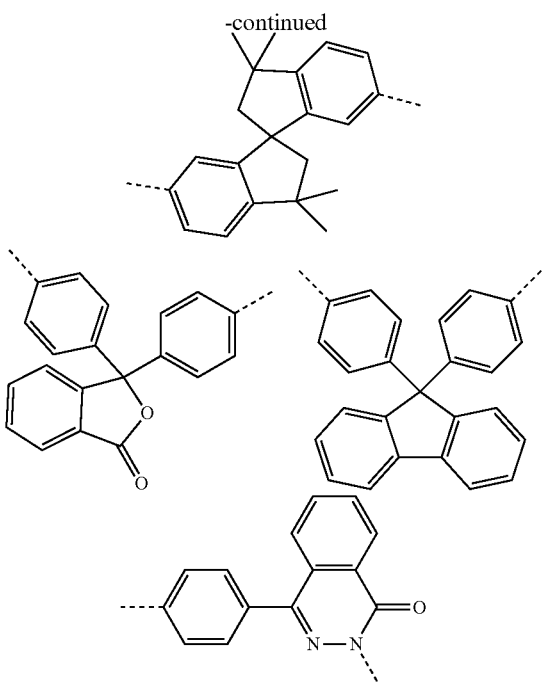

wherein
w is 1 to 5000,
x is 1 to 5000,
y is 0 to 5000,
z is 1 to 5000, and
wherein a ratio of (w+x):(y+z) ranges from 99:1 to 1:99;
wherein the copolymer is made by a method comprising:
reacting 2H-benzimidazol-2-one with bis(4-chlorophenyl)sulfone to provide a sulfone oligomer;
reacting the sulfone oligomer with a difluoro aromatic ketone of the formula

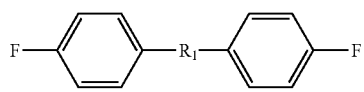

to provide a fluoro aromatic ketone-terminated sulfone oligomer; and
reacting the fluoro aromatic ketone-terminated sulfone oligomer with a bisphenol of the formula

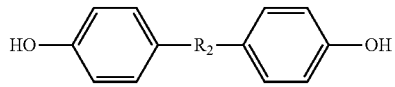

to provide the copolymer.

2. The composition according to claim 1, wherein w is 1 to 5000, x is 1 to 50, y is 0 to 50, and z is 1 to 5000, and wherein the ratio of (w+x):(y+z) ranges from 99:1 to 1:99 and a ratio of (w+z):(x+y) ranges from 99.95:0.05 to 60:40.

3. The composition according to claim 1, wherein w is 1 to 5000, x is 1, y is 1, and z is 1 to 5000, and wherein the ratio of (w+x):(y+z) ranges from 99:1 to 1:99.

4. The composition according to claim 1, wherein the copolymer has an inherent solution viscosity of at least 0.35 dL/g and less than 5.0 dL/g.

5. The composition according to claim 1, wherein the copolymer has a glass transition temperature $T_g$ of 190° C. to 345° C.

6. The composition according to claim 1, wherein $R_2$ is

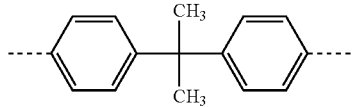

and the copolymer has a glass transition temperature $T_g$ of greater than 190° C.

7. The composition according to claim 1, wherein $R_2$ is

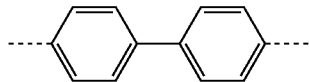

and the copolymer has a glass transition temperature $T_g$ of greater than 220° C.

8. The composition according to claim 1, wherein $R_2$

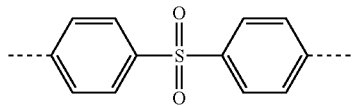

and the copolymer has a glass transition temperature $T_g$ of greater than 220° C.

9. The composition according to claim 1, wherein the copolymer has a glass transition temperature $T_g$ of greater than 240° C. and less than 350° C.

10. The composition according to claim 1, further comprising a polymer selected from the group consisting of polybenzimidazole, polyarylamides, polysulfones, polyketones, polyimides, polyetherimides, polyphenylenesulfides, fluoropolymers, polyamides, polyesters, polycarbonates and mixtures thereof.

11. The composition according to claim 10, further comprising a micro-powder fluoropolymer having an average particle size ranging from 0.01 to 50 μm and a melting temperature in the range of 150 to 400° C.

12. The composition according to claim 1, further comprising a filler selected from the group consisting of fibrous fillers and non-fibrous fillers.

13. The composition according to claim 12, wherein the filler is present in an amount ranging from 10 weight percent to 80 weight percent.

14. The composition according to claim 12, wherein said filler is selected from the group consisting of glass fiber, carbon fiber, carbon black, graphite, graphene, fluoropolymer, and mixtures thereof.

15. The composition of claim 1, further comprising at least one fibrous filler and at least one additional ingredient selected from the group consisting of colorants, pigments, light stabilizers, heat stabilizers, antioxidants, acid scavengers, processing aids, nucleating agents, lubricants, flame retardants, smoke-suppressing agents, anti-static agents, anti-blocking agents, conductivity additives, plasticizers, flow modifiers, extenders, metal deactivators and mixtures thereof.

16. An article of manufacture comprising the polymeric composition of claim 1, said article of manufacture selected from the group consisting of a substrate, sheet, film, multilayer structure, multilayer sheet, multilayer film, molded part, extruded shape, molded shape, cast membrane, coated part, pellet, powder, foam, fiber, flaked fiber, and combinations thereof.

17. A laminated article comprising at least two layers wherein a first layer of the at least two layers comprises the composition of claim 1 and the second layer of the at least two layers comprises a conductive material; wherein said conductive material is selected from the group consisting of copper, silver, gold, nickel, titanium, and mixtures thereof.

18. The laminated article of claim 17 wherein the laminated article is a circuit board.

* * * * *

UNITED STATES PATENT AND TRADEMARK OFFICE
CERTIFICATE OF CORRECTION

| | | |
|---|---|---|
| PATENT NO. | : 11,851,532 B2 | |
| APPLICATION NO. | : 17/369529 | |
| DATED | : December 26, 2023 | |
| INVENTOR(S) | : YiFeng Wang | |

It is certified that error appears in the above-identified patent and that said Letters Patent is hereby corrected as shown below:

In the Claims

In Claim 1, at Column 60, Line 55, the chemical formula should appear as follows:
HO-R2-OH Signed and Sealed this
Fourth Day of June, 2024

Katherine Kelly Vidal
Director of the United States Patent and Trademark Office